United States Patent
Hwang et al.

(10) Patent No.: US 12,230,682 B2
(45) Date of Patent: Feb. 18, 2025

(54) INTEGRATED CIRCUIT DEVICE

(71) Applicant: Samsung Electronics Co., Ltd., Suwon-si (KR)

(72) Inventors: Yoontae Hwang, Seoul (KR); Geunwoo Kim, Seoul (KR); Wandon Kim, Seongnam-si (KR); Hyunbae Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 391 days.

(21) Appl. No.: 17/672,033

(22) Filed: Feb. 15, 2022

(65) Prior Publication Data
US 2023/0012516 A1    Jan. 19, 2023

(30) Foreign Application Priority Data
Jul. 15, 2021  (KR) .......................... 10-2021-0093125

(51) Int. Cl.
| | |
|---|---|
| *H01L 29/417* | (2006.01) |
| *H01L 23/522* | (2006.01) |
| *H01L 29/45* | (2006.01) |

(52) U.S. Cl.
CPC .... *H01L 29/41733* (2013.01); *H01L 23/5226* (2013.01); *H01L 29/45* (2013.01)

(58) Field of Classification Search
CPC .................. H01L 29/41766; H01L 29/41725
See application file for complete search history.

(56) References Cited

U.S. PATENT DOCUMENTS

| | | |
|---|---|---|
| 8,835,305 B2 | 9/2014 | Yang et al. |
| 9,111,907 B2 | 8/2015 | Kamineni et al. |
| 9,997,416 B2 | 6/2018 | Adusumilli et al. |
| 10,361,120 B2 | 7/2019 | Wang et al. |
| 10,720,358 B2 | 7/2020 | Yin et al. |
| 10,727,347 B2 | 7/2020 | Huang et al. |
| 10,991,828 B2 | 4/2021 | Huang et al. |
| 2003/0067079 A1* | 4/2003 | Ishikawa ........... H01L 21/76873 257/774 |
| 2019/0273023 A1* | 9/2019 | Loh ................. H01L 21/823425 |
| 2021/0098376 A1* | 4/2021 | Lin ................... H01L 21/32134 |

\* cited by examiner

*Primary Examiner* — Michele Fan
(74) *Attorney, Agent, or Firm* — Harness, Dickey & Pierce, P.L.C.

(57) ABSTRACT

An integrated circuit (IC) device includes a conductive region including a first metal on a substrate. An insulating film is on the conductive region. A conductive plug including a second metal passes through the insulating film and extends in a vertical direction. A conductive barrier pattern is between the conductive region and the conductive plug. The conductive barrier pattern has a first surface in contact with the conductive region and a second surface in contact with the conductive plug. A bottom surface and a lower sidewall of the conductive plug are in contact with the conductive barrier pattern, and an upper sidewall of the conductive plug is in contact with the insulating film. The conductive barrier pattern includes a vertical barrier portion between the insulating film and the conductive plug, and the vertical barrier portion has a width tapering along a first direction away from the conductive region.

20 Claims, 34 Drawing Sheets

INTEGRATED CIRCUIT DEVICE

CROSS-REFERENCE TO RELATED APPLICATION

This application is based on and claims priority under 35 U.S.C. § 119 to Korean Patent Application No. 10-2021-0093125, filed on Jul. 15, 2021, in the Korean Intellectual Property Office, the disclosure of which is incorporated by reference herein in its entirety.

BACKGROUND

The inventive concept relates to an integrated circuit (IC) device, and/or to an IC device including a metal wiring layer.

Due to the development of electronics technology, the downscaling of IC devices has rapidly progressed. Accordingly, the linewidth and pitch of metal wiring layers included in the IC devices also have been miniaturized. Many existing IC devices have a metal wiring structure which is inadequate to suppress an increase in resistance of metal wiring layers and suppress the decrease in electrical characteristics and reliability associated with miniaturizing the linewidth and pitch of the metal wiring layers.

SUMMARY

The inventive concept provides an integrated circuit (IC) device having a metal wiring structure capable of suppressing an increase in resistance of metal wiring layers and improving electrical characteristics and reliability.

According to an aspect of the inventive concept, there is provided an IC device including a conductive region on a substrate. The conductive region includes a first metal. An insulating film is on the conductive region. A first conductive plug including a second metal passes through the insulating film and extends in a vertical direction. A conductive barrier pattern is between the conductive region and the first conductive plug. The conductive barrier pattern has a first surface in contact with the conductive region and a second surface in contact with the first conductive plug. A bottom surface and a lower sidewall of the first conductive plug are in contact with the conductive barrier pattern, and an upper sidewall of the first conductive plug is in contact with the insulating film. The conductive barrier pattern includes a vertical barrier portion between the insulating film and the first conductive plug, and the vertical barrier portion has a shape with a width in a lateral direction, the width tapering along a first direction away from the conductive region.

According to another aspect of the inventive concept, there is provided an IC device including a source/drain region on a substrate. The source/drain region has a top surface with a recess surface. A metal silicide film is along the recess surface of the source/drain region and includes a first metal. An insulating film is on the metal silicide film. A first conductive plug passes through the insulating film and extends in a vertical direction. The first conductive plug includes a second metal. A conductive barrier pattern is between the metal silicide film and the first conductive plug. The conductive barrier pattern includes a first surface in contact with the metal silicide film and a second surface in contact with the first conductive plug. A bottom surface and a lower sidewall of the first conductive plug are in contact with the conductive barrier pattern, and an upper sidewall of the first conductive plug is in contact with the insulating film. The conductive barrier pattern includes a vertical barrier portion between the insulating film and the first conductive plug, and the vertical barrier portion has a shape with a width in a lateral direction, the width tapering along a first direction away from the metal silicide film.

According to another aspect of the inventive concept, there is provided an IC including a fin-type active region protruding over a substrate. A source/drain region is on the fin-type active region. A metal silicide film is in contact with a top surface of the source/drain region. A gate line extends in a direction intersecting with the fin-type active region on the fin-type active region. An insulating structure is on the source/drain region, the metal silicide film, and the gate line. A source/drain contact passes through a first portion of the insulating structure in a vertical direction. The source/drain contact is connected to the source/drain region through the metal silicide film. A gate contact passes through a second portion of the insulating structure in the vertical direction. The gate contact is connected to the gate line. At least one of the source/drain contact and the gate contact includes a first conductive plug passing through the insulating structure and extending in the vertical direction. The first conductive plug has an upper sidewall in contact with the insulating structure. A conductive barrier pattern covers a bottom surface and a lower sidewall of the first conductive plug. The conductive barrier pattern includes a vertical barrier portion between the insulating structure and the first conductive plug, and the vertical barrier portion has a shape with a width in a lateral direction, the width tapering along a first direction away from the substrate.

BRIEF DESCRIPTION OF THE DRAWINGS

Example embodiments of the inventive concept will be more clearly understood from the following detailed description taken in conjunction with the accompanying drawings in which:

FIGS. 9A to 16 are cross-sectional views of a process sequence of a method of manufacturing an IC device, according to example embodiments, wherein FIGS. 9A, 10A, 11A, 12A, 13A, 14A, 15, and 16 are cross-sectional views of a portion corresponding to a cross-section taken along line X4-X4' of FIG. 6, according to the process sequence.

DETAILED DESCRIPTION OF THE EXAMPLE EMBODIMENTS

Figure 1:
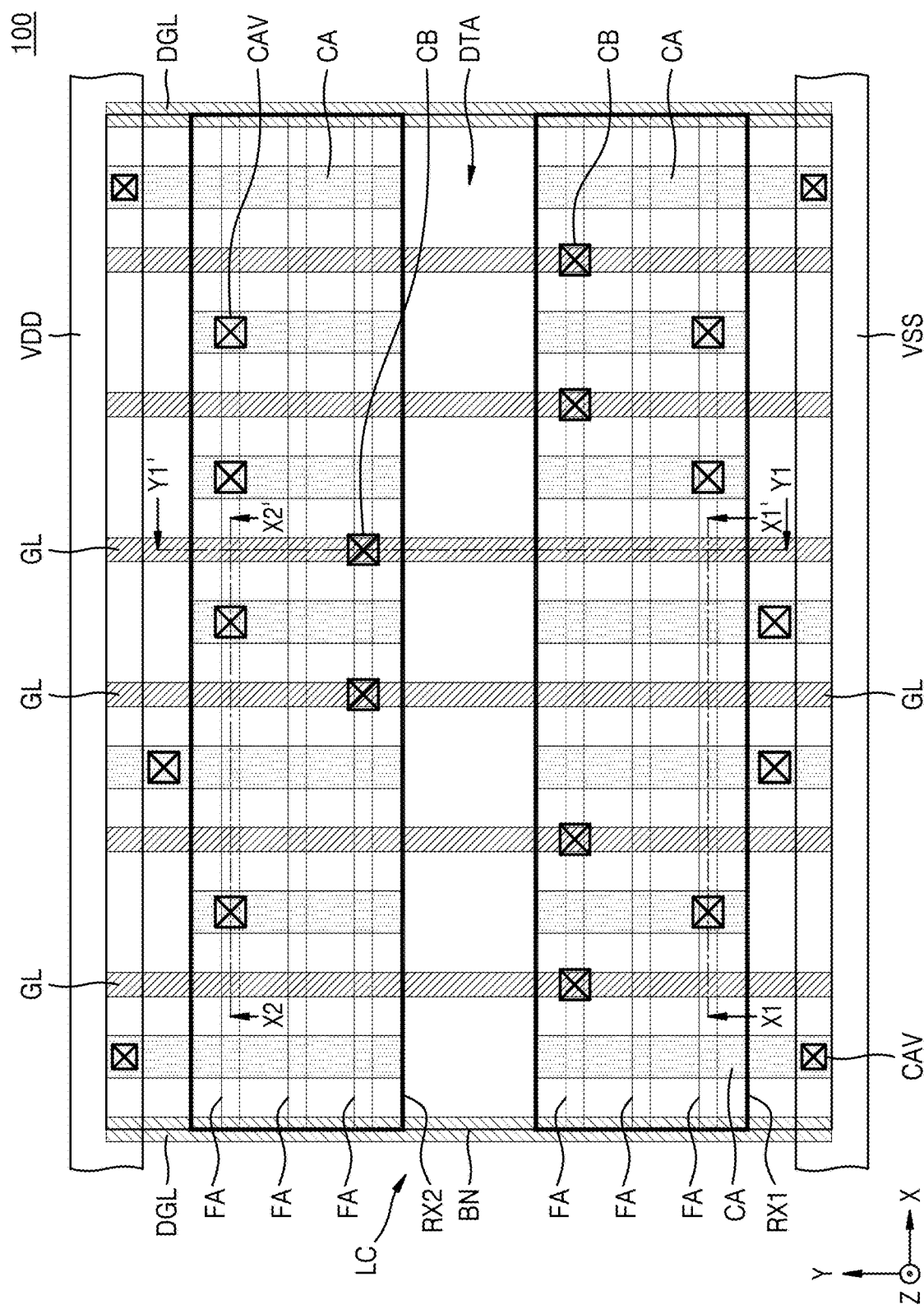
FIG. 1 is a plan layout diagram of an integrated circuit (IC) device according to example embodiments.

Hereinafter, example embodiments will be described in detail with reference to the accompanying drawings. The same reference numerals are used to denote the same elements in the drawings, and repeated descriptions thereof are omitted.

Figure 2A:
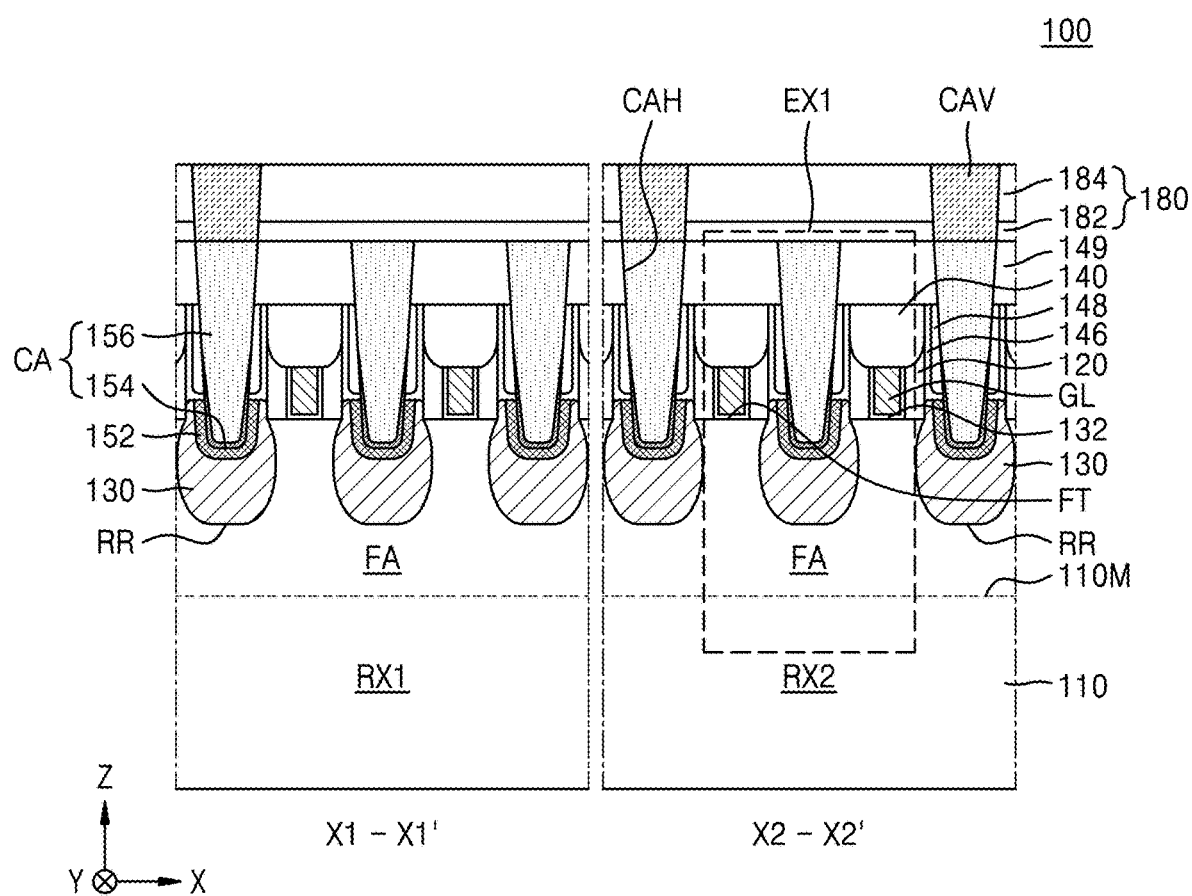
FIG. 2A is a cross-sectional view of some components corresponding to cross-sections taken along lines X1-X1' and X2-X2' of FIG. 1.
Figure 2B:
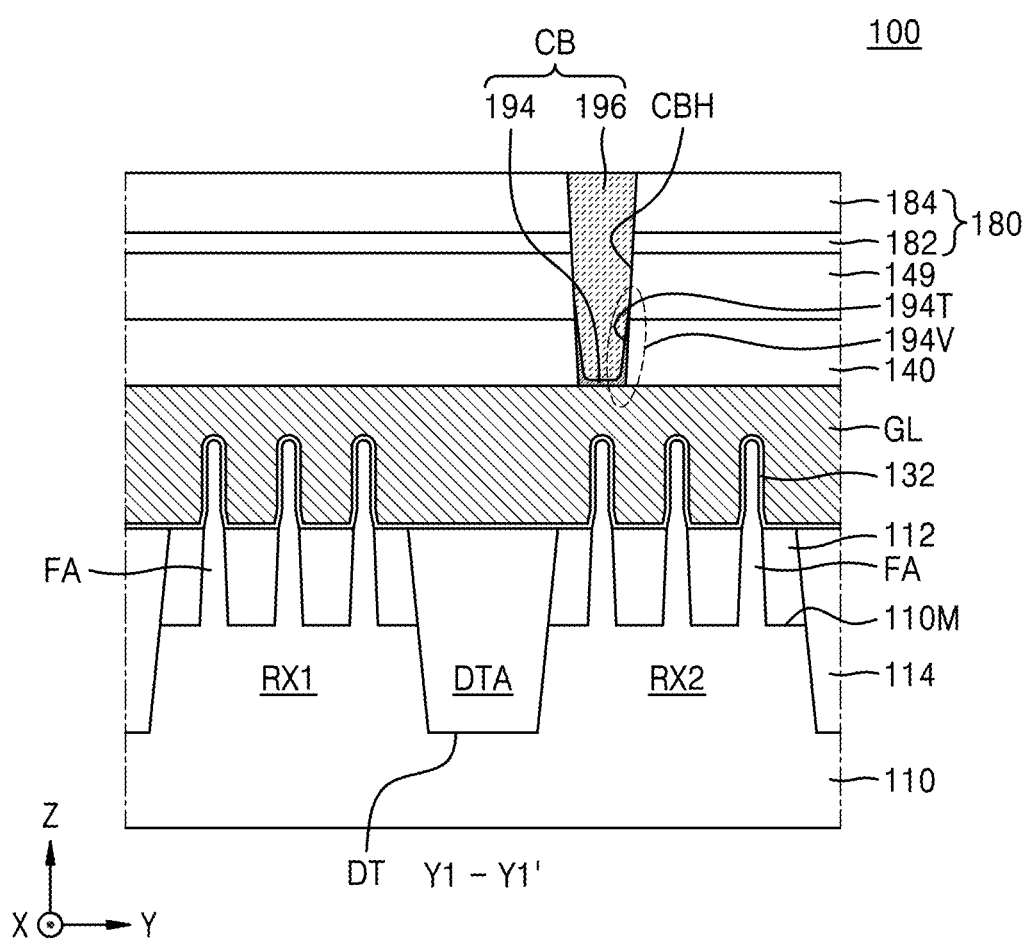
FIG. 2B is a cross-sectional view of some components corresponding to a cross-section taken along line Y1-Y1' of FIG. 1.
Figure 2C:
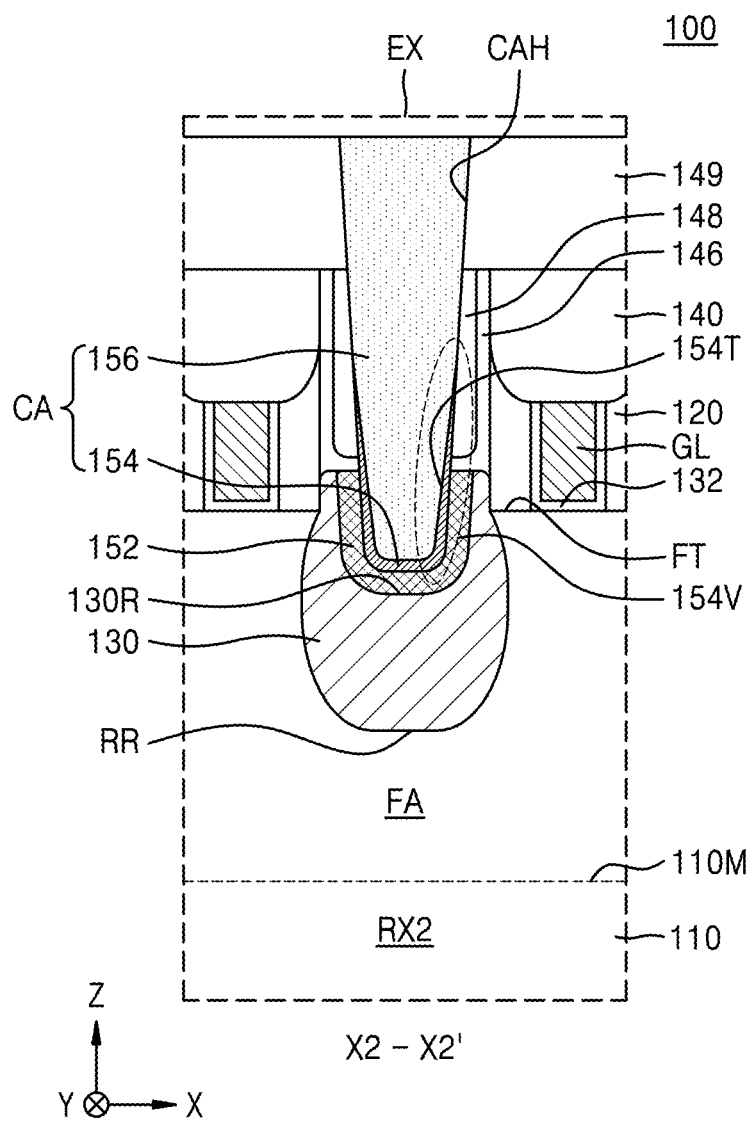
FIG. 2C is an enlarged cross-sectional view of region EX1 of FIG. 2A.

FIG. 1 is a plan layout diagram of an integrated circuit (IC) device 100 according to example embodiments. FIG. 2A is a cross-sectional view of some components corresponding to cross-sections taken along lines X1-X1' and X2-X2' of FIG. 1. FIG. 2B is a cross-sectional view of some components corresponding to a cross-section taken along line Y1-Y1' of FIG. 1. FIG. 2C is an enlarged cross-sectional view of region EX1 of FIG. 2A.

Referring to FIGS. 1 and 2A to 2C, the IC device 100 may include a logic cell including a fin field-effect transistor (FinFET) device. The IC device 100 may include a logic cell LC formed in a region defined by a cell boundary BN on a substrate 110.

The substrate 110 may have a main surface 110M, which extends in a lateral direction (a direction of an X-Y plane). The substrate 110 may include a semiconductor (e.g., silicon (Si) or germanium (Ge)) or a compound semiconductor (e.g., silicon germanium (SiGe), silicon carbide (SiC), gallium arsenide (GaAs), indium arsenide (InAs), or indium phosphide (InP)). The substrate 110 may include a conductive region, for example, a doped well or a doped structure.

The logic cell LC may include a first device region RX1 and a second device region RX2. A plurality of fin-type active regions FA may be in each of the first device region RX1 and the second device region RX2 and protrude from the substrate 110. The plurality of fin-type active regions FA may extend parallel to each other in a widthwise direction of the logic cell LC (i.e., a first lateral direction (X direction)).

As shown in FIG. 2B, a device isolation film 112 may be on the substrate 110 in the first device region RX1 and the second device region RX2. The device isolation film 112 may be between the plurality of fin-type active regions FA and cover a lower sidewall of each of the fin-type active regions FA. In the first device region RX1 and the second device region RX2, each of the plurality of fin-type active regions FA may protrude as a fin type over the device isolation film 112. An inter-device isolation region DTA may be between the first device region RX1 and the second device region RX2. A deep trench DT may be formed in the inter-device isolation region DTA to define the first device region RX1 and the second device region RX2. The deep trench DT may be filled with an inter-device isolation insulating film 114. Each of the device isolation film 112 and the inter-device isolation insulating film 114 may include an oxide film On the substrate 110, a plurality of gate insulating films 132 and a plurality of gate lines GL may extend in a height direction (i.e., a second lateral direction (Y direction)) of the logic cell LC, which is a direction intersecting with the plurality of fin-type active regions FA. The plurality of gate insulating films 132 and the plurality of gate lines GL may cover a top surface and both sidewalls of each of the plurality of fin-type active regions FA, a top surface of the device isolation film 112, and a top surface of the inter-device isolation insulating film 114.

A plurality of metal-oxide-semiconductor (MOS) transistors may be formed along the plurality of gate lines GL in the first device region RX1 and the second device region RX2. Each of the plurality of MOS transistors may be a MOS transistor having a three-dimensional (3D) structure in which a channel is formed in the top surface and the both sidewalls of one of the plurality of fin-type active regions FA. In example embodiments, the first device region RX1 may be an NMOS transistor region, and a plurality of NMOS transistors may be formed at intersections between the fin-type active regions FA and the gate lines GL in the first device region RX1. The second device region RX2 may be a PMOS transistor region, and a plurality of PMOS transistors may be formed at intersections between the fin-type active regions FA and the gate lines GL in the second device region RX2.

A dummy gate line DGL may extend along a portion of the cell boundary BN, which extends in the second lateral direction (Y direction). The dummy gate line DGL may include the same material as the plurality of gate lines GL. The dummy gate line DGL may be maintained in an electrical floating state during an operation of the IC device 100 and function as an electrical isolation region between the logic cell LC and other logic cell adjacent thereto. The plurality of gate lines GL and a plurality of dummy gate lines DGL may each have the same width in the first lateral direction (X direction) and be arranged at a constant pitch in the first lateral direction (X direction).

The plurality of gate insulating films 132 may include a silicon oxide film, a high-k dielectric film, or a combination thereof. The high-k dielectric film may include a material having a higher dielectric constant than a silicon oxide film. The high-k dielectric film may include a metal oxide or a metal oxynitride. An interface film (not shown) may be between the fin-type active region FA and the gate insulating film 132. The interface film may include an oxide film, a nitride film, or an oxynitride film.

Each of the plurality of gate lines GL and the plurality of dummy gate lines DGL may have a structure in which a metal nitride layer, a metal layer, a conductive capping layer, and a gap-fill metal film are sequentially stacked. The metal nitride layer and the metal layer may include at least one metal selected from titanium (Ti), tantalum (Ta), tungsten (W), ruthenium (Ru), niobium (Nb), molybdenum (Mo), and hafnium (Hf). The gap-fill metal film may include a tungsten (W) film or an aluminum (Al) film. Each of the plurality of gate lines GL and a plurality of dummy gate lines DGL may include a work-function metal-containing film. The work-function metal-containing film may include at least one metal selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). In example embodiments, each of the plurality of gate lines GL and the plurality of dummy gate lines DGL may include a stack structure of TiAlC/TiN/W, a stack structure of TiN/TaN/TiAlC/TiN/W, or a stack structure of TiN/TaN/TiN/TiAlC/TiN/W, without being limited thereto.

A plurality of insulating spacers 120 may cover sidewalls of the plurality of gate lines GL and the plurality of dummy gate lines DGL, respectively. The plurality of gate lines GL, the plurality of dummy gate lines DGL, the plurality of gate insulating films 132, and the plurality of insulating spacers 120 may be covered by insulating capping lines 140. Each of the insulating capping lines 140 and the plurality of insulating spacers 120 may extend in a line shape in the second lateral direction (Y direction).

Each of the plurality of insulating spacers 120 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), or a combination thereof, without being limited thereto. A combination may include any number of the listed materials and may not include some of the listed materials. The plurality of insulating capping lines 140 may include silicon nitride (SiN). As used herein, each of the terms "SiN," "SiCN," "SiBN," "SiON," "SiOCN," and "SiBCN" refers to a material including elements included therein, without referring to a chemical formula representing a stoichiometric relationship.

The plurality of recess regions RR may be formed in the top surfaces of the plurality of fin-type active regions FA, respectively. The plurality of gate lines GL may include a pair of gate lines GL, which are adjacent to one recess region RR and apart from each other with the one recess region RR therebetween. The plurality of source/drain regions 130 may be inside the plurality of recess regions RR. At least some of the plurality of source/drain regions 130 may be between a pair of gate lines GL. The gate line GL may be apart from the source/drain region 130 with the gate insulating film 132 and the insulating spacer 120 therebetween.

The plurality of source/drain regions 130 may include an epitaxial semiconductor layer epitaxially grown from the plurality of recess regions RR. For example, the plurality of source/drain regions 130 may include an epitaxially grown Si layer, an epitaxially grown SiC layer, or a plurality of epitaxially grown SiGe layers. When the first device region RX1 may be an NMOS transistor region and the second device region RX2 may be a PMOS transistor region, the plurality of source/drain regions 130 in the first device region RX1 may include a Si layer doped with an n-type dopant or a SiC layer doped with an n-type dopant, and the plurality of source/drain regions 130 in the second device region RX2 may include a SiGe layer doped with a p-type dopant. The n-type dopant may be selected from phosphorus (P), arsenic (As), and antimony (Sb). The p-type dopant may be selected from boron (B) and gallium (Ga).

In example embodiments, the plurality of source/drain regions 130 in the first device region RX1 may have a different shape and a different size from the plurality of source/drain regions 130 in the second device region RX2. A shape of each of the plurality of source/drain regions 130 is not limited to that shown in FIGS. 2A and 2C. A plurality of source/drain regions 130 having various shapes and sizes may be formed in the first device region RX1 and the second device region RX2.

As shown in FIG. 2C, a recess surface 130R may be formed in the top surface of each of the plurality of source/drain regions 130. The plurality of metal silicide films 152 may be along the recess surfaces 130R of the plurality of source/drain regions 130 on the plurality of source/drain regions 130, respectively. Each of the plurality of metal silicide films 152 may cover the top surface of the source/drain region 130. Each of the plurality of source/drain regions 130 and the plurality of metal silicide films 152 may constitute a conductive region.

Each of the plurality of metal silicide films 152 may include a first metal. In example embodiments, the first metal may include Ti, W, Ru, Nb, Mo, Hf, Ni, Co, Pt, Yb, Tb, Dy, Er, or Pd. For example, the metal silicide film 152 may include titanium silicide, without being limited thereto.

An insulating liner 146 and an inter-gate dielectric film 148 may be sequentially on the plurality of source/drain regions 130 and the plurality of metal silicide films 152. The insulating liner 146 and the inter-gate dielectric film 148 may constitute a lower insulating structure. In example embodiments, the insulating liner 146 may include SiN, SiCN, SiBN, SiON, SiOCN, SiBCN, or a combination thereof, without being limited thereto. The inter-gate dielectric film 148 may include a silicon oxide film, without being limited thereto.

Each of a plurality of source/drain contacts CA may pass through the inter-gate dielectric film 148 and the insulating liner 146 in a vertical direction (Z direction) and be connected to the source/drain region 130 through the metal silicide film 152. Each of the plurality of source/drain contacts CA may be apart from the gate line GL with the insulating spacer 120 therebetween in the first lateral direction (X direction). Each of the plurality of source/drain regions 130 may be connected to an upper conductive line through the metal silicide film 152 and the source/drain contact CA.

Each of the plurality of source/drain contacts CA may include a conductive barrier pattern 154 and a conductive plug 156 (first conductive plug), which are sequentially stacked on the metal silicide film 152.

The conductive plug 156 may pass through the inter-gate dielectric film 148 and the insulating liner 146 and extend long in the vertical direction (Z direction). The conductive barrier pattern 154 may be between the metal silicide film 152 and the conductive plug 156. The conductive barrier pattern 154 may include a surface in contact with the metal silicide film 152 and a surface in contact with the conductive plug 156. A bottom surface and a lower sidewall of the conductive plug 156 may be in contact with the conductive barrier pattern 154, and an upper sidewall of the conductive plug 156 may be in contact with the lower insulating structure including the insulating liner 146 and the inter-gate dielectric film 148.

The conductive plug 156 may include a second metal. The conductive barrier pattern 154 may include a third metal. In example embodiments, the first metal included in the metal silicide film 152, the second metal included in the conductive plug 156, and the third metal included in the conductive barrier pattern 154 may respectively include different elements. In other example embodiments, some of the first metal, the second metal, and the third metal may include different elements. In still other example embodiments, at least some of the first metal, the second metal, and the third metal may include the same element.

As an example, the second metal may include a different element from the first metal included in the metal silicide film 152. As another example, the first metal and the second metal may include the same element. As still another example, the first metal and the third metal may include different elements. As yet another example, the first metal and the third metal may include the same element. In example embodiments, when the first metal included in the metal silicide film 152 includes a different element from the second metal included in the conductive plug 156, because the conductive pattern 154 is between the metal silicide film 152 and the conductive plug 156, the intermixing of metal atoms between the metal silicide film 152 and the conductive plug 156 may be blocked by the conductive barrier pattern 154.

In example embodiments, the second metal may include a metal solely including one element selected from molybdenum (Mo), copper (Cu), tungsten (W), cobalt (Co), ruthenium (Ru), manganese (Mn), titanium (Ti), tantalum (Ta), and aluminum (Al) or include a metal including a combination thereof, without being limited thereto. The conductive barrier pattern 154 may include titanium (Ti), tantalum (Ta), tungsten (W), titanium nitride (TiN), tantalum nitride (TaN), tungsten nitride (WN), tungsten carbonitride (WCN), titanium silicon nitride (TiSiN), tantalum silicon nitride (TaSiN), tungsten silicon nitride (WSiN), or a combination thereof, without being limited thereto.

As shown in FIGS. 2A and 2C, the conductive barrier pattern 154 may have a variable thickness according to a position thereof. The conductive barrier pattern 154 may include a vertical barrier portion 154V. The vertical barrier portion 154V may include a portion between the metal silicide film 152 and the conductive plug 156 and a portion between the conductive plug 156 and the lower insulating structure including the insulating liner 146 and the inter-gate dielectric film 148. The vertical barrier portion 154V may have a shape of which a width may be gradually reduced in the lateral direction (e.g., X direction) in a direction away from the substrate 110 or the metal silicide film 152. Restated, the vertical barrier portion 154V may have the width in a lateral direction that tapers along a direction away from the substrate 110 or the metal silicide film 152. In example embodiments, the vertical barrier portion 154V of the conductive barrier pattern 154 may have a ring shape surrounding the conductive plug 156 in a view from above (e.g., on an X-Y plane).

A surface of the conductive barrier pattern 154, which may be in contact with the metal silicide film 152, may have a convex shape toward the substrate 110, and a surface of the conductive barrier pattern 154, which may be in contact with the conductive plug 156, may have a concave shape toward the conductive plug 156. A width of a lower portion of the conductive plug 156 in a lateral direction (e.g., X direction) may be defined by the vertical barrier portion 154V of the conductive barrier pattern 154, and a width of an upper portion of the conductive plug 156 in the lateral direction (e.g., X direction) may be defined by the lower insulating structure including the insulating liner 146 and the inter-gate dielectric film 148.

As shown in FIG. 2C, the vertical barrier portion 154V of the conductive barrier pattern 154 may have a tapered surface 154T facing the conductive plug 156. The distance between the tapered surface 154T and the lower insulating structure including the insulating liner 146 and the inter-gate dielectric film 148 may decrease along a direction away from the substrate 110 or the metal silicide film 152 in the vertical direction (Z direction) or a direction away from the substrate 110 or the metal silicide film 152. For example, a distance between the tapered surface 154T and the inter-gate dielectric film 148 in the lateral direction may be gradually reduced in a direction away from the metal silicide film 152 in the vertical direction (Z direction).

In example embodiments, the conductive barrier pattern 154 may have a thickness greater than 0 nm and equal to or less than 1 nm between the metal silicide film 152 and the conductive plug 156. A thickness of the vertical barrier portion 154V of the conductive barrier pattern 154 may be gradually reduced within a range of about 1 nm or less in a direction away from the metal silicide film 152 in the vertical direction (Z direction).

The IC device 100 may include an insulating film 149, which covers the top surface of each of the plurality of source/drain contacts CA and a top surface of each of the plurality of insulating capping lines 140. Each of the plurality of source/drain contacts CA may be inside a source/drain contact hole CAH, which passes through the insulating film 149 in the vertical direction (Z direction). The upper sidewall of the conductive plug 156 included in each of the plurality of source/drain contacts CA may be in contact with the insulating film 149. The insulating film 149 may constitute a middle insulating structure. In example embodiments, the insulating film 149 may include silicon oxide film, without being limited thereto.

As shown in FIGS. 2A and 2B, a top surface of the insulating film 149 and the top surface of each of the plurality of source/drain contacts CA may be covered by an upper insulating structure 180. The upper insulating structure 180 may include an etch stop film 182 and an interlayer insulating film 184, which are sequentially stacked on the plurality of source/drain contacts CA and the insulating film 149. The etch stop film 182 may include silicon carbide (SiC), silicon nitride (SiN), nitrogen (N)-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The interlayer insulating film 184 may include an oxide film, a nitride film, an ultralow-k (ULK) film having a ultralow dielectric constant K of about 2.2 to about 2.4, or a combination thereof. For example, the interlayer insulating film 184 may include a tetraethyl orthosilicate (TEOS) film, a high-density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, without being limited thereto.

As shown in FIGS. 1 and 2A, a plurality of via contacts CAV may be on the plurality of source/drain contacts CA. Each of the plurality of via contacts CAV may pass through the upper insulating structure 180 and be in contact with the conductive plug 156 of the source/drain contact CA. The plurality of via contacts CAV may constitute an upper wiring structure.

In example embodiments, the plurality of via contacts CAV may include a fourth metal. The fourth metal may include the same element as the second metal included in the conductive plug 156. For example, each of a plurality of conductive plugs 156 and the plurality of via contacts CAV may include molybdenum. In other example embodiments, the fourth metal may include a different element from the second metal included in the conductive plug 156.

In example embodiments, bottom surfaces of the plurality of via contacts CAV may be in contact with top surfaces of the conductive plugs 156, respectively. Each of the plurality of via contacts CAV may include an upper conductive plug, which may be in direct contact with the conductive plug 156 without passing through a separate conductive barrier film. In a case where the via contact CAV and the conductive plug 156 include the same metal, even when the intermixing of metal atoms occurs between the via contact CAV and the conductive plug 156, the intermixing phenomenon may not affect the electrical characteristics of the IC device 100. Accordingly, a separate conductive barrier film configured to block the intermixing phenomenon may not be between the conductive plug 156 and the via contact CAV.

In example embodiments, the upper conductive plug 156 may include a metal solely including one element selected from molybdenum, copper, tungsten, cobalt, ruthenium, manganese, titanium, tantalum, and aluminum or include a metal including a combination thereof, without being limited thereto. For example, the upper conductive plug 156 included in each of the plurality of via contacts CAV may include molybdenum.

As shown in FIGS. 1 and 2B, a plurality of gate contacts CB may be on the plurality of gate lines GL. Each of the plurality of gate contacts CB may pass through the upper insulating structure 180, the insulating film 149, and the insulating capping line 140 and be in contact with a top surface of the gate line GL. Each of the plurality of gate lines GL may be connected to the upper conductive line through the gate contact CB.

As shown in FIG. 2B, the gate contact CB may include a conductive barrier pattern 194 and a conductive plug 196, which are sequentially stacked on the gate line GL. The conductive barrier pattern 194 may include a vertical barrier portion 194V between an insulating structure including the insulating capping line 140 and the insulating film 149 and the conductive plug 196. The vertical barrier portion 194V may have a shape of which a width may be gradually reduced in a lateral direction (e.g., X direction) in a direction away from the substrate 110 or the gate line GL. Restated, the width may taper along a direction away from the substrate 110 or the gate line GL. In example embodiments, the vertical barrier portion 194V of the conductive barrier pattern 194 may have a ring shape surrounding the conductive plug 196 in a view from above (e.g., on an X-Y plane).

The vertical barrier portion 194V of the conductive barrier pattern 194 may have a tapered surface 194T facing the conductive plug 196. The distance between the tapered surface 194T and the insulating structure including the insulating capping line 140 and the insulating film 149 may decrease along a direction away from the substrate 110 or the gate line GL in the vertical direction (Z direction) or a direction away from the substrate 110 or the gate line GL. For example, a distance between the tapered surface 194T and the insulating capping line 140 in the lateral direction may be gradually reduced in a direction away from the gate line GL in the vertical direction (Z direction). Detailed configurations and effects of the conductive barrier pattern 194 and the conductive plug 196 may be substantially the same as those of the conductive barrier pattern 154 and the conductive plug 156 of the source/drain contact CA, which have been described with reference to FIGS. 1 and 2A to 2C.

As shown in FIG. 1, in the logic cell LC, a ground line VSS may be connected to the fin-type active region FA in the first device region RX1 through one of the plurality of source/drain contacts CA, which is in the first device region RX1. A power line VDD may be connected to the fin-type active region FA in the second device region RX2 through one of the plurality of source/drain contacts CA, which is in the second device region RX2. The ground line VSS and the power line VDD may be formed at a higher level than the top surface of each of the plurality of source/drain contacts CA and the plurality of gate contacts CB.

In example embodiments, the ground line VSS and the power line VDD may include a conductive barrier pattern and a wiring conductive layer, respectively. The conductive barrier pattern and the wiring conductive layer, which are respectively included in the ground line VSS and the power line VDD, may have substantially the same configurations as the conductive barrier pattern 154 and the conductive plug 156 of the source/drain contact CA, which have been described above.

In the IC device 100 shown in FIGS. 1 and 2A to 2C, the plurality of source/drain contacts CA may include the conductive barrier pattern 154 and the conductive plug 156, and the gate contact CB may include the conductive barrier pattern 194 and the conductive plug 196. The conductive barrier patterns 154 and 194 may be in contact with the bottom surfaces and the lower surfaces of the conductive plugs 156 and 196 without being in contact with the upper sidewalls of the conductive plugs 156 and 196. Accordingly, portions of the plurality of source/drain contacts CA and the gate contact CB, which are taken up by the conductive barrier patterns 154 and 194, may be minimized Thus, increases in resistances due to the conductive barrier patterns 154 and 194 may be minimized in the plurality of source/drain contacts CA4 and the gate contact CB4. In addition, because an upper space of the source/drain contact hole CAH in which the source/drain contact CA is contained and an upper space of a gate contact hole CBH in which the gate contact CB is contained are not taken up by the conductive barrier patterns 154 and 194, an upper inner space of each of the source/drain contact hole CAH and the gate contact hole CBH may widen, and thus, gap-fill characteristics may be improved during the formation of the source/drain contact CA and the gate contact CB. Thus, undesired defects (e.g., voids) may be prevented from being generated in the source/drain contact hole CAH and the gate contact hole CBH, and the conductive plugs 156 and 196 including a high-quality metal-containing film may be obtained. Accordingly, even when the IC device 100 has a device region having a reduced area due to the downscaling of IC devices, the electrical characteristics and reliability of the IC device 100 may be improved while reducing a contact resistance of each of the source/drain contact CA and the gate contact CB.

Figure 3:
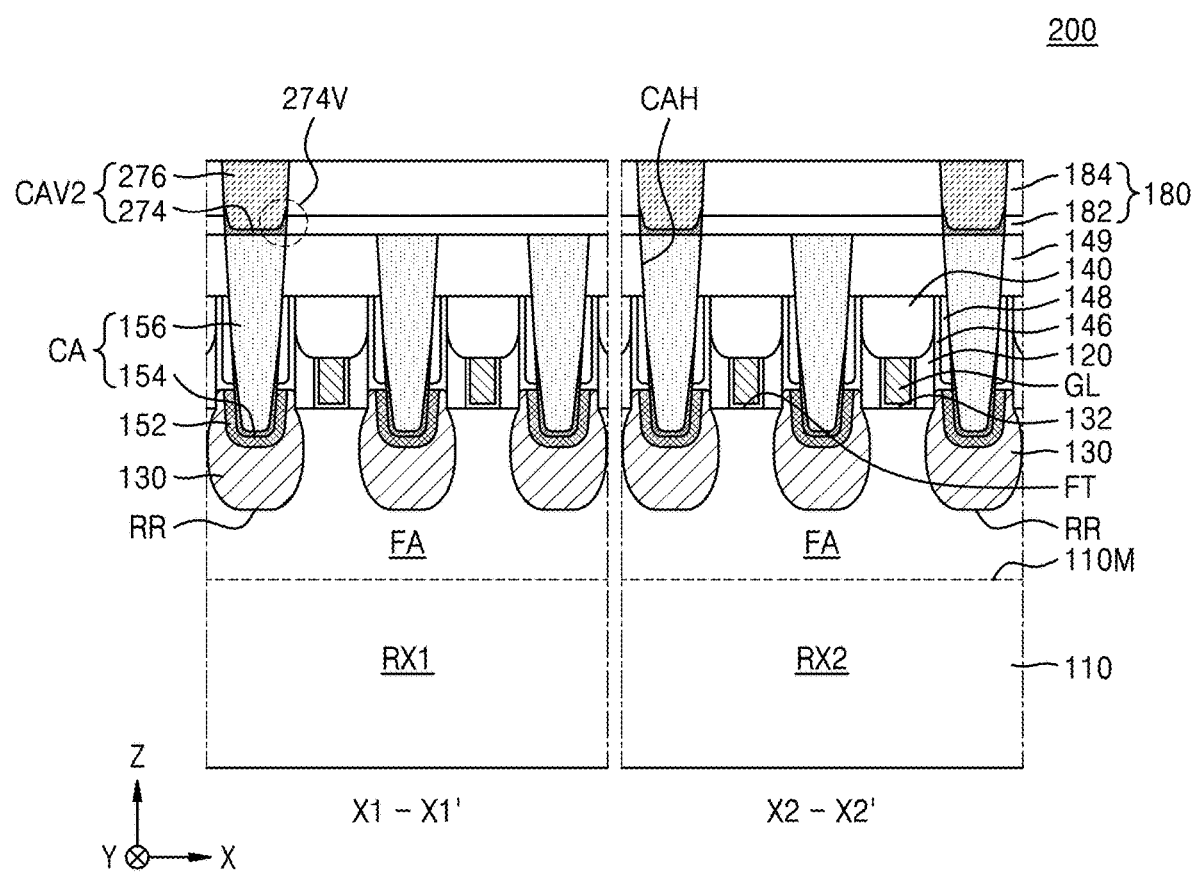
FIG. 3 is a cross-sectional view of an IC device according to example embodiments.

FIG. 3 is a cross-sectional view of an IC device 200 according to example embodiments. FIG. 3 illustrates a cross-sectional configuration of regions of the IC device 200, which correspond to a cross-section taken along lines X1-X1' and X2-X2' of FIG. 1. In FIG. 3, the same reference numerals are used to denote the same elements as in FIGS. 2A to 2C, and detailed descriptions thereof are omitted.

Referring to FIG. 3, the IC device 200 may have substantially the same configuration as the IC device 100 described with reference to FIGS. 1 and 2A to 2C. However, the IC device 200 may include a plurality of via contacts CAV2 instead of the plurality of via contacts CAV.

Each of the plurality of via contacts CAV2 may pass through an upper insulating structure 180 and be in contact with a conductive plug 156 of a source/drain contact CA. The plurality of via contacts CAV2 may constitute an upper wiring structure.

Each of the plurality of via contacts CAV2 may include an upper conductive barrier pattern 274 and an upper conductive plug 276, which are sequentially stacked on the conducive plug 156 of the source/drain contact CA. In each of the plurality of via contacts CAV2, a bottom surface and a lower sidewall of the upper conductive plug 276 may be in contact with the upper conductive barrier pattern 274, and an upper sidewall of the upper conductive plug 276 may be in contact with the upper insulating structure 180.

The upper conductive barrier pattern 274 may include an upper conductive line 274V between the upper insulating structure 180 and the upper conductive plug 276. The upper conductive line 274V may have a shape of which a width is gradually reduced in a lateral direction (e.g., X direction) in a direction away from the conductive plug 156 of the source/drain contact CA. In example embodiments, the upper conductive line 274V of the upper conductive barrier pattern 274 may have a ring shape surrounding the upper conductive plug 276 in a view from above (e.g., on an X-Y plane). Detailed configurations and effects of the upper conductive barrier pattern 274 and the upper conductive plug 276 may be substantially the same as those of the conductive barrier pattern 154 and the conductive plug 156 of the source/drain contact CA, which have been described with reference to FIGS. 1 and 2A to 2C.

Figure 4:
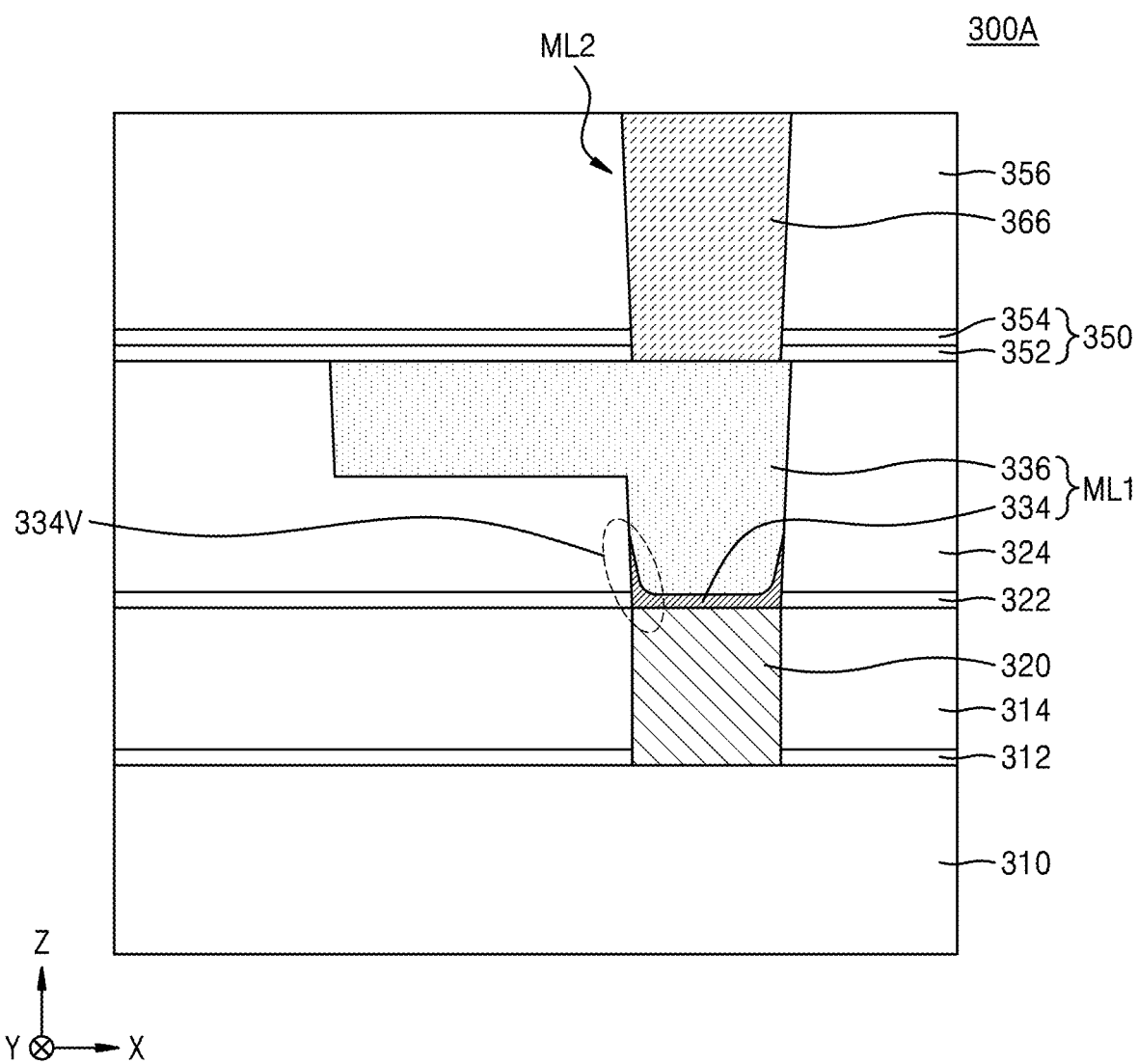
FIG. 4 is a cross-sectional view of main components of an IC device according to example embodiments.

FIG. 4 is a cross-sectional view of main components of an IC device 300A according to example embodiments.

Referring to FIG. 4, the IC device 300A may include a lower structure 310. The lower structure 310 may include a semiconductor substrate including a semiconductor (e.g., Si or Ge) or a compound semiconductor (e.g., SiGe, SiC, GaAs, InAs, or InP). The lower structure 310 may include a conductive region (not shown). The conductive region may include a doped well, a doped structure, or conductive layer. In example embodiments, the lower structure 310 may include circuit elements (not shown), such as a gate structure, an impurity region, and a contact plug. For example, the lower structure 310 may include structures of the IC device 100, which are described with reference to FIGS. 1 and 2A to 2C, or structures of the IC device 200, which are described with reference to FIG. 3.

A first etch stop film 312 and a lower insulating film 314 may be sequentially stacked on the lower structure 310, and a lower wiring structure 320 may pass through the lower insulating film 314 and the first etch stop film 312 and be on the lower structure 310.

The first etch stop film 312 may include a material having an etch selectivity with respect to the lower insulating film 314. In example embodiments, the first etch stop film 312 may include a silicon nitride film, a carbon-doped silicon nitride film, or a carbon-doped silicon oxynitride film. In other example embodiments, the first etch stop film 312 may include a metal nitride film, for example, an aluminum nitride (AlN) film. In example embodiments, the lower insulating film 314 may include a silicon oxide film. For example, the lower insulating film 314 may include a silicon oxide-based material, such as plasma-enhanced oxide (PEOX), TEOS, boro TEOS (BTEOS), phosphorous TEOS (PTEOS), boro phospho TESO (BPTEOS), boro silicate glass (BSG), phospho silicate glass (PSG), and BPSG. In other example embodiments, the lower insulating film 314 may have a low-k dielectric film (e.g., a SiOC film or a SiCOH film) having a low dielectric constant K of about 2.2 to about 3.0. The lower wiring structure 320 may include a metal film and a conductive barrier film surrounding the metal film. The metal film may include molybdenum (Mo), copper (Cu), tungsten (W), aluminum (Al), or cobalt (Co). The conductive barrier film may include Ti, Ta, W, TiN, TaN, WN, WCN, TiSiN, TaSiN, WSiN, or a combination thereof. In example embodiments, the lower wiring structure 320 may be electrically connected to the conductive region formed in the lower structure 310. In some other example embodiments, the lower wiring structure 320 may be connected to a source/drain region (not shown) or a gate electrode (not shown) of a transistor formed in the lower structure 310.

A second etch stop film 322 and a first insulating film 324 may be sequentially arranged on the lower insulating film 314. A first metal wiring structure ML1 may pass through an insulating structure including the first insulating film 324 and the second etch stop film 322 and extend to the lower wiring structure 320.

The first metal wiring structure ML1 may include a lower conductive barrier pattern 334 and a lower conductive line 336, which are sequentially stacked on the lower wiring structure 320. The lower conductive line 336 may include a plug-shaped portion adjacent to the lower wiring structure 320 and a line-shaped portion integrally connected to the plug-shaped portion. The line-shaped portion of the lower conductive line 336 may be apart from the lower conductive barrier pattern 334 with the plug-shaped portion therebetween.

In the first metal wiring structure ML1, a bottom surface and a lower sidewall of the plug-shaped portion of the lower conductive line 336 may be in contact with the lower conductive barrier pattern 334, and an upper sidewall of the plug-shaped portion of the lower conductive line 336 may be in contact with the first insulating film 324. An outer surface of the line-shaped portion of the lower conductive line 336 may be in contact with the first insulating film 324.

The lower conductive barrier pattern 334 may include a vertical barrier portion 334V between the lower conductive line 336 and the insulating structure including the second etch stop film 322 and the first insulating film 324. The vertical barrier portion 334V may have a shape of which a width is gradually reduced in a lateral direction (e.g., X direction) in a direction away from the lower wiring structure 320. In example embodiments, the vertical barrier portion 334V of the lower conductive barrier pattern 334 may have a ring shape surrounding the lower conductive line 336 in a view from above (e.g., on an X-Y plane). Detailed configurations and effects of the lower conductive barrier pattern 334 and the lower conductive line 336 may be substantially the same as those of the conductive barrier pattern 154 and the conductive plug 156 of the source/drain contact CA, which have been described with reference to FIGS. 1 and 2A to 2C.

The IC device 300A may include an insulating capping layer 350, which covers a top surface of each of the first metal wiring structure ML1 and the first insulating film 324. In example embodiments, the insulating capping layer 350 may include a multilayered structure including a first insulating capping layer 352 including a metal and a second insulating capping layer 354 that is free of a metal. In example embodiments, the first insulating capping layer 352 may include AlN, AlON, AlO, or AlOC, and the second insulating capping layer 354 may include SiC, SiN, SiC:N, or SiOC, without being limited thereto. In example embodiments, any one of the first insulating capping layer 352 and the second insulating capping layer 354 may be omitted from the insulating capping layer 350.

The insulating capping layer 350 may be covered by a second insulating film 356. A second metal wiring structure ML2 may pass through an insulating structure including the insulating capping layer 350 and the second insulating film 356 and be connected to the first metal wiring structure ML1. A constituent material of the second insulating film 356 may be the same as that of the lower insulating film 314 described above.

The second metal wiring structure ML2 may be in contact with a top surface of the lower conductive line 336. The second metal wiring structure ML2 may include an upper wiring 366, which is in direct contact with the lower conductive line 336 of the first metal wiring structure ML1 without passing through a separate conductive barrier film. In example embodiments, the upper wiring 366 may include a metal solely including one element selected from molybdenum, copper, tungsten, cobalt, ruthenium, manganese, titanium, tantalum, and aluminum or include a metal including a combination thereof, without being limited thereto. In example embodiments, the lower conductive line 336 of the first metal wiring structure ML1 may include the same metal as the upper wiring 366 included in the second metal wiring structure ML2. For example, each of the lower conductive line 336 of the first metal wiring structure ML1 and the upper wiring 366 included in the second metal wiring structure ML2 may include molybdenum (Mo), without being limited thereto.

Figure 5:
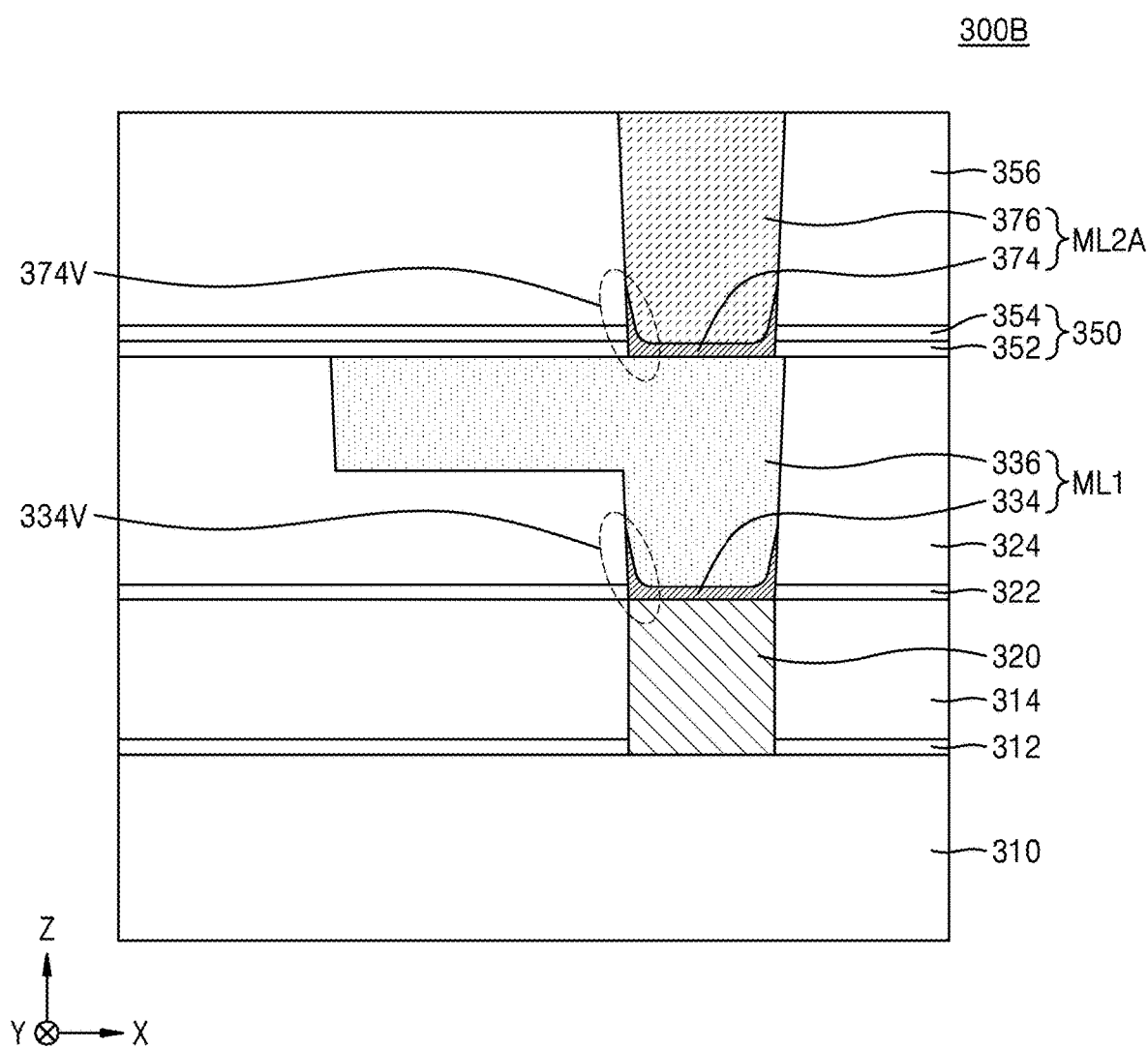
FIG. 5 is a cross-sectional view of an IC device according to example embodiments.

FIG. 5 is a cross-sectional view of an IC device 300B according to example embodiments. In FIG. 5, the same reference numerals are used to denote the same elements as in FIG. 4, and detailed descriptions thereof are omitted.

Referring to FIG. 5, the IC device 300B may have substantially the same configuration as the IC device 300A described with reference to FIG. 4. However, the IC device 300B may include a second metal wiring structure ML2A instead of the second metal wiring structure ML2.

The second metal wiring structure ML2A may pass through an insulating structure including an insulating capping layer 350 and a second insulating film 356 and be connected to a first metal wiring structure ML1. The second metal wiring structure ML2A may constitute an upper wiring structure.

The second metal wiring structure ML2A may include an upper conductive barrier pattern 374 and an upper conductive line 376, which are sequentially stacked on a lower conductive line 336 of the first metal wiring structure ML1. The upper conductive line 376 may include a plug-shaped portion adjacent to the first metal wiring structure ML1 and a line-shaped portion integrally connected to the plug-shaped portion. The line-shaped portion may be apart from the upper conductive barrier pattern 374 with the plug-shaped portion therebetween.

In example embodiments, a line-shaped portion included in the lower conductive line 336 may extend long in a first lateral direction (X direction), and the line-shaped portion included in the upper conductive line 376 may extend long in a second lateral direction (Y direction), which intersects with the first lateral direction (X direction).

In the second metal wiring structure ML2A, a bottom surface and a lower sidewall of the plug-shaped portion of the upper conductive line 376 may be in contact with the upper conductive barrier pattern 374, and an upper sidewall of the plug-shaped portion of the upper conductive line 376 may be in contact with the second insulating film 356. An outer surface of the line-shaped portion of the upper conductive line 376 may be in contact with the second insulating film 356.

The upper conductive barrier pattern 374 may include an upper vertical barrier portion 374V between the upper conductive line 376 and the insulating structure including the insulating capping layer 350 and the second insulating film 356. The upper vertical barrier portion 374V may have a shape of which a width is gradually reduced in a lateral direction (e.g., X direction) in a direction away from the first metal wiring structure ML1. In example embodiments, the upper vertical barrier portion 374V may have a ring shape surrounding the upper conductive line 376 in a view from above (e.g., on an X-Y plane). Detailed configurations and effects of the upper conductive barrier pattern 374 and the upper conductive line 376 may be substantially the same as those of the conductive barrier pattern 154 and the conductive plug 156 of the source/drain contact CA, which have been described with reference to FIGS. 1 and 2A to 2C.

Figure 6:
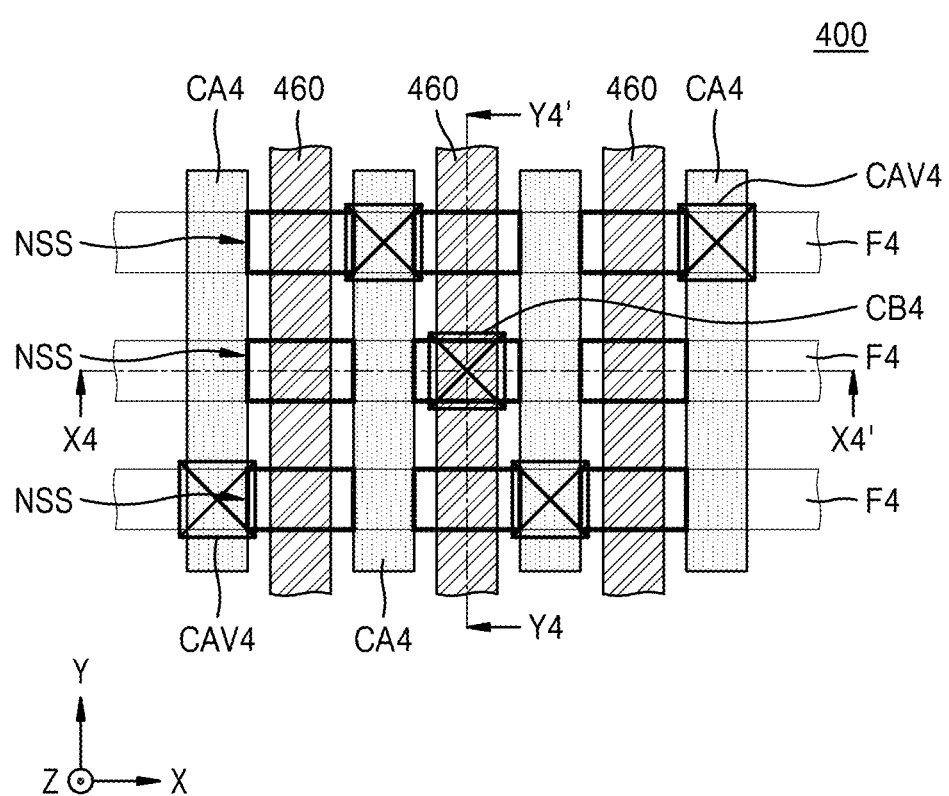
FIG. 6 is a plan layout diagram of some components of an IC device according to example embodiments.
Figure 7A:
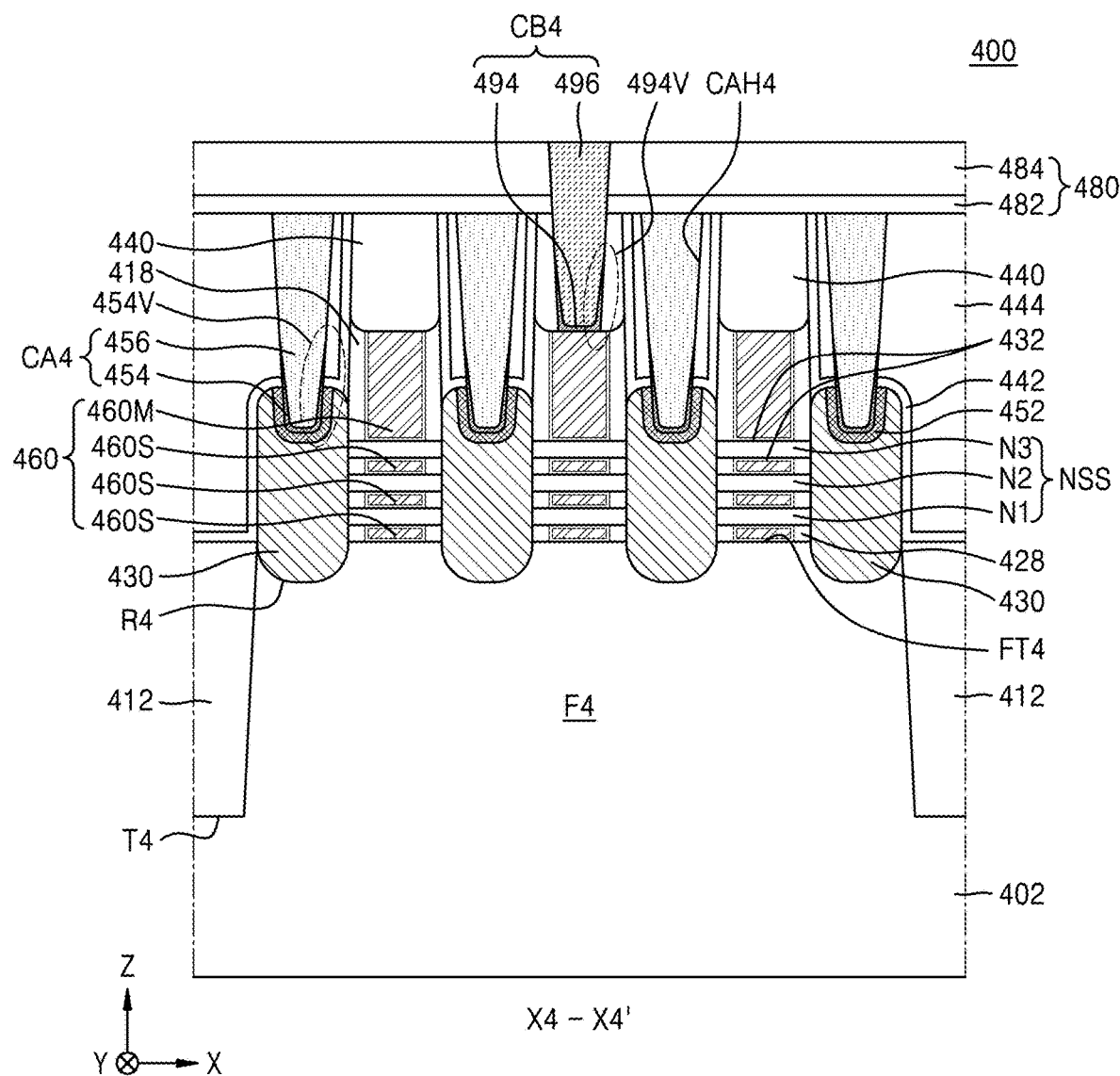
FIG. 7A is a cross-sectional view taken along line X4-X4' of FIG. 6.
Figure 7B:
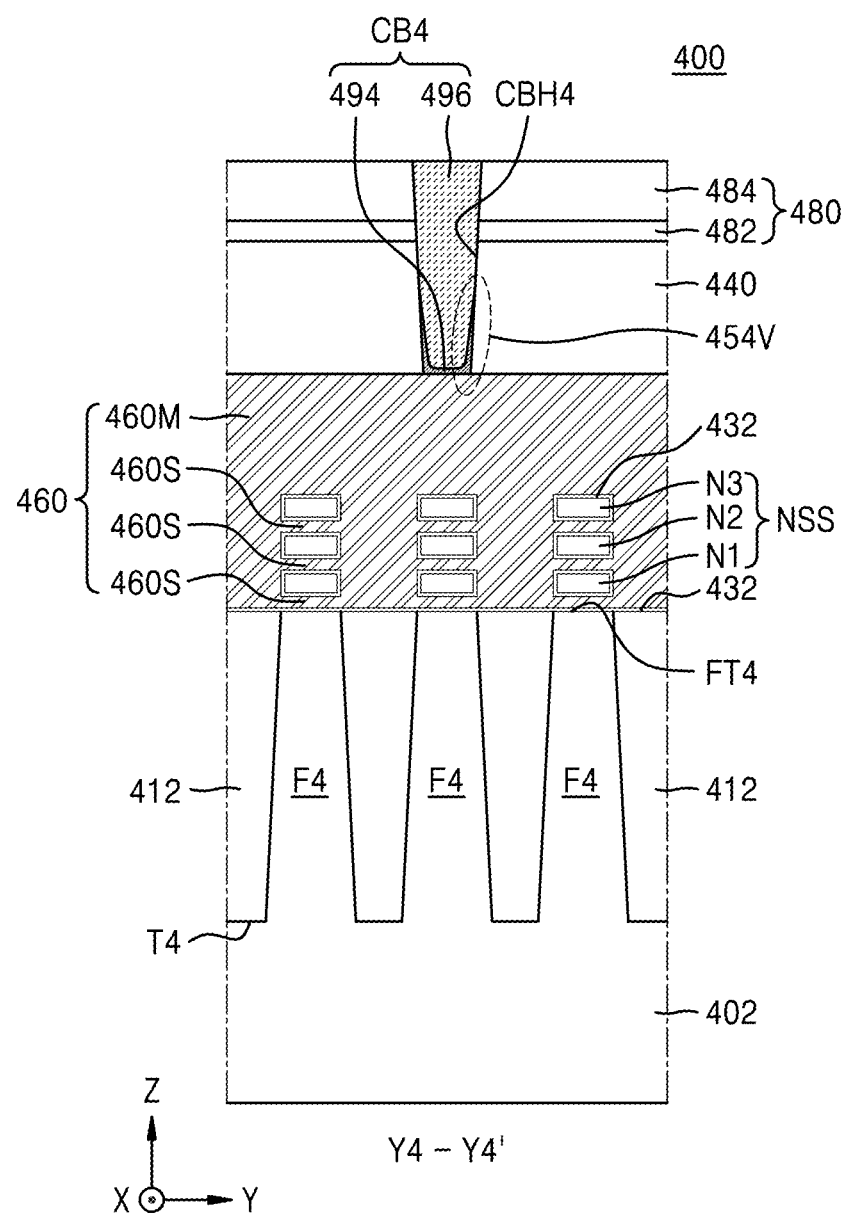
FIG. 7B is a cross-sectional view taken along line Y4-Y4' of FIG. 6.

FIG. 6 is a plan layout diagram of some components of an IC device 400 according to example embodiments. FIG. 7A is a cross-sectional view taken along line X4-X4' of FIG. 6. FIG. 7B is a cross-sectional view taken along line Y4-Y4' of FIG. 6.

Referring to FIGS. 6, 7A, and 7B, the IC device 400 may include a plurality of fin-type active regions F4 and a plurality of nanosheet stacks NSS. The plurality of fin-type active regions F4 may protrude from a substrate 402 and extend long in a first lateral direction (X direction). The plurality of nanosheet stacks NSS may be apart upward from the plurality of fin-type active regions F4 in a vertical direction (Z direction) and face top surfaces FT4 of the plurality of fin-type active regions F4. As used herein, the term "nanosheet" refers to a conductive structure having a cross-section that is substantially perpendicular to a direction in which current flows. The nanosheet should be interpreted as including a nanowire.

Trenches T4 may be formed in the substrate 402 to define the plurality of fin-type active regions F4, and then filled with a device isolation film 412. The substrate 402, the plurality of fin-type active regions F4, and the device isolation film 412 may respectively have substantially the same configurations as the substrate 110, the fin-type active region FA, and the device isolation film 112 described with reference to FIGS. 2A to 2C.

A plurality of gate lines 460 may extend on the plurality of fin-type active regions F4 in the second lateral direction (Y direction). The plurality of nanosheet stacks NSS may be respectively on the top surfaces FT4 of the plurality of fin-type active regions F4 in regions where the plurality of fin-type active regions F4 intersect with the plurality of gate lines 460. Also, the plurality of nanosheet stacks NSS may be apart from the fin-type active regions F4 and face the top surfaces FT4 of the fin-type active regions F4. On the substrate 402, a plurality of nanosheet transistors may be formed at intersections between the plurality of fin-type active regions F4 and the plurality of gate lines 460.

Each of the plurality of nanosheet stacks NSS may include a plurality of nanosheets (e.g., N1, N2, and N3), which overlap each other in the vertical direction (Z direction) on the top surface FT4 of the fin-type active region F4. The plurality of nanosheets (e.g., N1, N2, and N3) may include a first nanosheet N1, a second nanosheet N2, and a third nanosheet N3, which are at different vertical distances from the top surface FT4 of the fin-type active region F4.

FIG. 6 illustrates a case in which the nanosheet stack NSS approximately has a rectangular planar shape, without being limited thereto. The nanosheet stack NSS may have various planar shapes according to a planar shape of each of the fin-type active region F4 and the gate line 460. The present example embodiment pertains to an example configuration in which the plurality of nanosheet stacks NSS and the plurality of gate lines 460 are formed on one fin-type active region F4, and the plurality of nanosheet stacks NSS are arranged in a line in the first lateral direction (X direction) on one fin-type active region F4. However, according to the inventive concept, the number of nanosheet stacks NSS on one fin-type active region is not specifically limited. For example, one nanosheet stack NSS may be formed on one fin-type active region F4. The present example embodiment pertains to a case in which each of the plurality of nanosheet stacks NSS includes three nanosheets, but the inventive concept is not limited thereto. For example, the nanosheet stack NSS may include at least one nanosheet, and the number of nanosheets included in the nanosheet stack NSS is not specifically limited.

Each of the first to third nanosheets N1, N2, and N3 may have a channel region. In example embodiments, each of the first to third nanosheets N1, N2, and N3 may include a Si layer, a SiGe layer, or a combination thereof.

A plurality of recess regions R4 may be formed in an upper portion of the fin-type active region F4, and a plurality of source/drain regions 430 may be on the plurality of recess regions R4. The plurality of source/drain regions 430 may include an epitaxial semiconductor layer. A detailed configuration of the plurality of source/drain regions 430 may be the same as that of the source/drain regions 130 described with reference to FIGS. 2A and 2C.

The gate line 460 may surround each of the first to third nanosheets N1, N2, and N3 and cover the nanosheet stack NSS on the fin-type active region F4. Each of the plurality of gate lines 460 may include a main gate portion 460M and a plurality of sub-gate portions 460S. The main gate portion 460M may cover a top surface of the nanosheet stack NSS and extend long in the second lateral direction (Y direction). The plurality of sub-gate portions 460S may be integrally connected to the main gate portion 460M and arranged one by one between the first to third nanosheets N1, N2, and N3 and between the fin-type active region F4 and the first nanosheet N1. The first to third nanosheets N1, N2, and N3 may have a gate-all-around (GAA) structure surrounded by the gate line 460. The gate line 460 may include a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may include TiAlC. A gate insulating film 432 may be between the nanosheet stack NSS and the gate line 460. The gate insulating film 432 may have substantially the same configuration as the gate insulating film 132 described with reference to FIGS. 2A to 2C.

A metal silicide film 452 may be formed in a top surface of each of the plurality of source/drain regions 430. The metal silicide film 452 may have substantially the same configuration as the metal silicide film 152 described with reference to FIGS. 2A and 2C.

Both sidewalls of the plurality of gate lines 460 may be respectively covered by a plurality of outer insulating spacers 418. The plurality of outer insulating spacers 418 may cover both sidewalls of the main gate portions 460M on the plurality of nanosheet stacks NSS. The plurality of outer insulating spacers 418 and the plurality of source/drain regions 430 may be covered by an insulating liner 442. Each of the outer insulating spacer 418 and the insulating liner 442 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon dioxide (SiO$_2$), or a combination thereof. The insulating liner 442 may be omitted.

A plurality of inner insulating spacers 428 may be between the first to third nanosheets N1, N2, and N3 and between the fin-type active region F4 and the first nanosheet N1. Both sidewalls of each of the plurality of sub-gate portions 460S may be covered by the inner insulating spacers 428 with the gate insulating film 432 therebetween. The plurality of inner insulating spacers 428 may be between the plurality of sub-gate portions 460S and the source/drain region 430. In example embodiments, the outer insulating spacer 418 may include the same insulating material as the inner insulating spacer 428. In other example embodiments, the outer insulating spacer 418 may include a different insulating material from the inner insulating spacer 428. The inner insulating spacer 428 may include SiN, SiCN, SiBN, SiON, SiOCN, SiBCN, SiOC, SiO$_2$, or a combination thereof. The inner insulating spacer 428 may further include an air gap. In example embodiments, the plurality of inner insulating spacers 428 may be omitted. In this case, each of the plurality of source/drain regions 430 may be in contact with the gate insulating film 432, which is between the source/drain region 430 and the sub-gate portion 460S.

The insulating liner 442 may be covered by an inter-gate dielectric film 444. The inter-gate dielectric film 444 may include a silicon oxide film. A plurality of source/drain contacts CA4 may be inside a plurality of source/drain contact holes CAH4, which pass through the inter-gate dielectric film 444 and the insulating liner 442. Each of the plurality of source/drain contacts CA4 may be connected to the source/drain region 430 through the metal silicide film 452. Each of the plurality of source/drain contacts CA4 may include a conductive barrier pattern 454 and a conductive plug 456, which are sequentially stacked on the metal silicide film 452.

The conductive plug 456 may pass through the inter-gate dielectric film 444 and the insulating liner 442 and extend long in the vertical direction (Z direction). The conductive barrier pattern 454 may be between the metal silicide film 452 and the conductive plug 456. The conductive barrier pattern 454 may have a surface in contact with the metal silicide film 452 and a surface in contact with the conductive plug 456. A bottom surface and a lower sidewall of the conductive plug 456 may be in contact with the conductive barrier pattern 454, and an upper sidewall of the conductive plug 456 may be in contact with a lower insulating structure including the insulating liner 442 and the inter-gate dielectric film 444.

As shown in FIG. 7A, the conductive barrier pattern 454 may include a vertical barrier portion 454V between the conductive plug 456 and the lower insulating structure including the insulating liner 442 and the inter-gate dielectric film 444. The vertical barrier portion 454V may have a shape of which a width is gradually reduced in a lateral direction (e.g., X direction) in a direction away from the substrate 402 or the metal silicide film 452. In example embodiments, the vertical barrier portion 454V of the conductive barrier pattern 454 may have a ring shape surrounding the conductive plug 456 in a view from above (e.g., on an X-Y plane).

A surface of the conductive barrier pattern 454, which is in contact with the metal silicide film 452, may have a convex shape toward the substrate 402, and a surface of the conductive barrier pattern 454, which is in contact with the conductive plug 456, may have a concave shape toward the conductive plug 456. A width of a lower portion of the conductive plug 456 in a lateral direction (e.g., X direction) may be defined by the vertical barrier portion 454V of the conductive barrier pattern 454, and a width of an upper portion of the conductive plug 456 in the lateral direction (e.g., X direction) may be defined by the lower insulating structure including the insulating liner 442 and the inter-gate dielectric film 444.

Detailed configurations and effects of the conductive barrier pattern 454 and the conductive plug 456 may be substantially the same as those of the conductive barrier pattern 154 and the conductive plug 156 of the source/drain contact CA, which have been described with reference to FIGS. 1 and 2A to 2C.

Each of the plurality of gate lines 460 may be covered by an insulating capping line 440. The insulating capping line 440 may have substantially the same configuration as the insulating capping line 140 described with reference to FIGS. 2A to 2C.

The IC device 400 may include an upper insulating structure 480, which covers a top surface of each of the plurality of source/drain contacts CA4, a plurality of insulating capping lines 440, and the inter-gate dielectric film 444. The upper insulating structure 480 may include an etch stop film 482 and an interlayer insulating film 484, which are sequentially stacked on the source/drain contact CA4 and the insulating capping line 440. The etch stop film 482 and the interlayer insulating film 484 may respectively have substantially the same configuration as the etch stop film 182 and the interlayer insulating film 184, which have been described with reference to FIGS. 2A and 2B.

As shown in FIG. 6, the plurality of via contacts CAV4 may be on the plurality of source/drain contacts CA4. Each of the plurality of via contacts CAV4 may pass through the upper insulating structure 480 and be in contact with the top surface of the source/drain contact CA4. In example embodiments, each of the plurality of via contacts CAV4 may have substantially the same configuration as each of the plurality of via contacts CAV described with reference to FIG. 2A. In other example embodiments, each of the plurality of via contacts CAV4 may have substantially the same configuration as each of the plurality of via contacts CAV2 described with reference to FIG. 3.

As shown in FIGS. 6, 7A, and 7B, a gate contact CB4 may be on the gate line 460. The gate contact CB4 may be within a gate contact hole CBH4, which passes through the upper insulating structure 480 and the insulating capping line 440 in the vertical direction (Z direction), and be connected to a top surface of the gate line 460.

The gate contact CB4 may include a conductive barrier pattern 494 and a conductive plug 496, which are sequentially stacked on the gate line 460. The conductive barrier pattern 494 may include a vertical barrier portion 494V between an insulating structure including the insulating capping line 440 and the conductive plug 496. The vertical barrier portion 494V may have a shape of which a width is gradually reduced in a lateral direction (e.g., X direction) in a direction away from the substrate 402 or the gate line 460. In example embodiments, the vertical barrier portion 494V of the conductive barrier pattern 494 may have a ring shape surrounding the conductive plug 496 in a view from above (e.g., on an X-Y plane). Detailed configurations and effects of the conductive barrier pattern 494 and the conductive plug 496 may be substantially the same as those of the conductive barrier pattern 154 and the conductive plug 156 of the source/drain contact CA, which have been described with reference to FIGS. 1 and 2A to 2C.

In the IC device 400 described with reference to FIGS. 6, 7A, and 7B, the source/drain contact CA4 may include the conductive barrier pattern 454 and the conductive plug 456, and the gate contact CB4 may include the conductive barrier pattern 494 and the conductive plug 496. The conductive barrier patterns 454 and 494 may be in contact with the bottom surfaces and the lower sidewalls of the conductive plugs 456 and 496 without being in contact with the upper sidewalls of the conductive plugs 456 and 496. Accordingly, portions of the source/drain contacts CA4 and the gate contact CB4, which are taken up by the conductive barrier patterns 454 and 494, may be minimized. Thus, increases in resistances due to the conductive barrier patterns 454 and 494 may be minimized in the plurality of source/drain contacts CA4 and the gate contact CB4. In addition, because an upper space of the source/drain contact hole CAH4 in which the source/drain contact CA4 is contained and an upper space of the gate contact hole CBH4 in which the gate contact CB4 is contained are not taken up by the conductive barrier patterns 454 and 494, an upper inner space of each of the source/drain contact hole CAH4 and the gate contact hole CBH4 may widen, and thus, gap-fill characteristics may be improved during the formation of the source/drain contact CA4 and the gate contact CB4. Thus, undesired defects (e.g., voids) may be prevented from being generated in the source/drain contact hole CAH4 and the gate contact hole CBH4, and the conductive plugs 456 and 496 including a high-quality metal-containing film may be obtained. Accordingly, even when the IC device 400 has a device region having a reduced area due to the downscaling of IC devices, the electrical characteristics and reliability of the IC device 400 may be improved while reducing a contact resistance of each of the source/drain contact CA4 and the gate contact CB4.

Hereinafter, a method of manufacturing an IC device according to example embodiments will be described in detail.

FIGS. 8A to 8J are cross-sectional views of a process sequence of a method of manufacturing an IC device, according to example embodiments. Specifically, FIGS. 8A to 8J are cross-sectional views of partial regions of portions corresponding to a cross-section taken along line X2-X2' of FIG. 1, according to the process sequence. A method of manufacturing the IC device 100 shown in FIGS. 1 and 2A to 2C, according to an example embodiment, will be described with reference to FIGS. 8A to 8J. Although a process sequence in a partial region of a second device region RX2 is illustrated in FIGS. 8A to 8J, processes that are the same as or similar to processes described below may be performed also on a first device region RX1. In FIGS. 8A to 8J, the same reference numerals are used to denote the same elements as in FIGS. 1 and 2A to 2C, and detailed descriptions thereof are omitted.

Figure 8A:
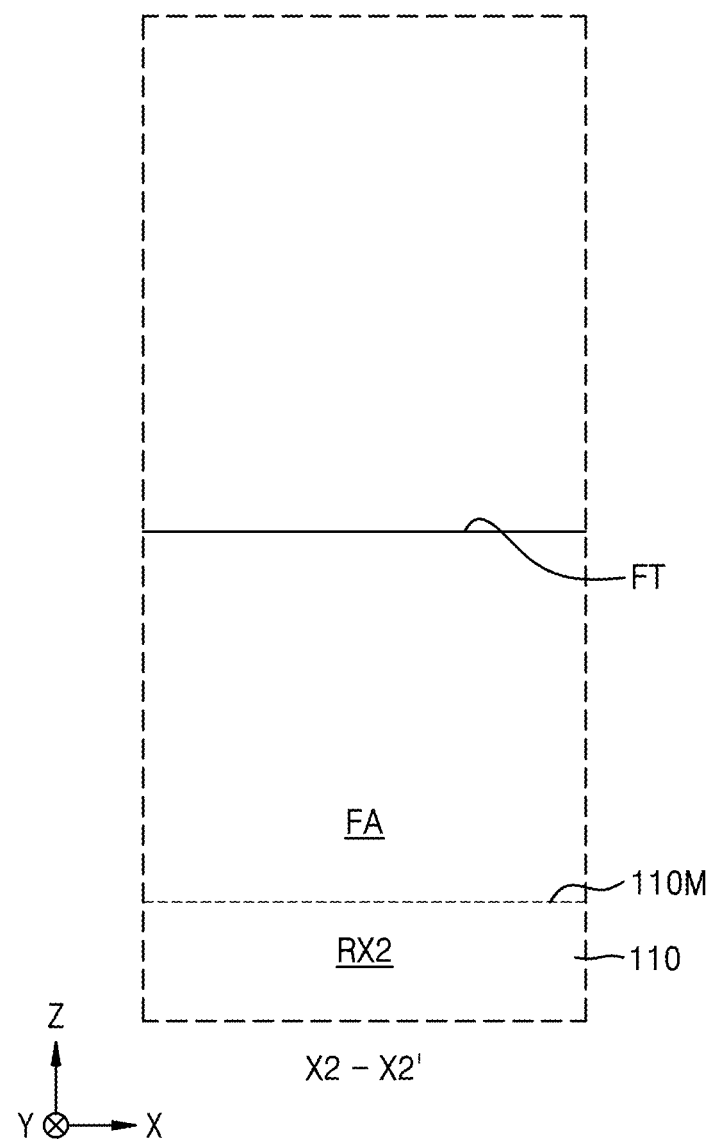
FIGS. 8A to 8J are cross-sectional views of a process sequence of a method of manufacturing an IC device, according to example embodiments.

Referring to FIG. 8A, partial regions of a substrate 110 may be etched in the first device region RX1 and the second device region RX2 (refer to FIGS. 1 and 2A) to form a plurality of fin-type active regions FA, which protrude over a main surface 110M of the substrate 110 upward in a vertical direction (Z direction) and extend parallel to each other in a first lateral direction (X direction). Also, a device isolation film 112 (refer to FIG. 2B) may be formed to cover both lower sidewalls of each of the plurality of fin-type active regions FA. Thereafter, a portion of the device isolation film 112 and a portion of the substrate 110 may be etched to form a deep trench DT (refer to FIG. 2B) defining the first device region RX1 and the second device region RX2, and the deep trench DT may be then filled with an inter-device isolation insulating film 114. As shown in FIG. 2B, after the deep trench DT is filled with the inter-device isolation insulating film 114 in the inter-device isolation region DTA, the plurality of fin-type active regions FA may protrude over a top surface of the device isolation film 112 in the first device region RX1 and the second device region RX2.

Figure 8B:
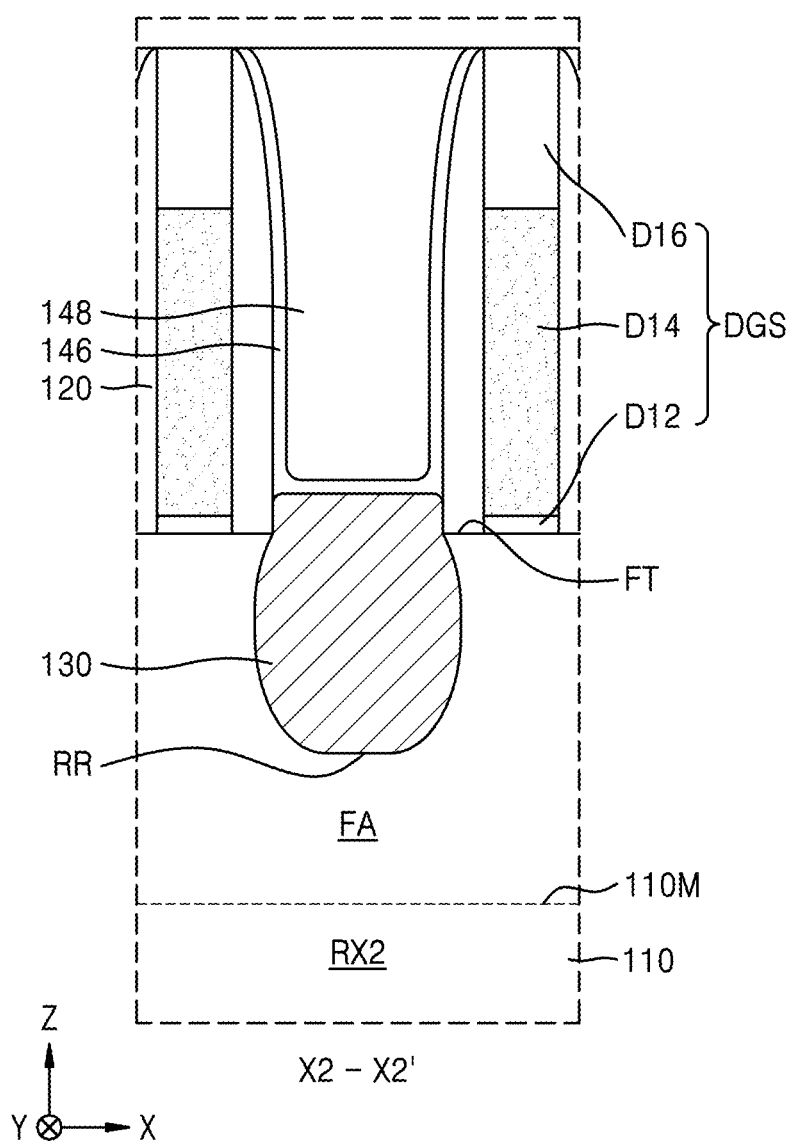

Referring to FIG. 8B, a plurality of dummy gate structures DGS may be formed on the device isolation film 112 and the inter-device isolation insulating film 114 (refer to FIG. 2B) and extend to intersect with the plurality of fin-type active regions FA. Each of the plurality of dummy gate structures DGS may include a dummy gate insulating film D12, a dummy gate line D14, and a dummy insulating capping layer D16, which are sequentially stacked on a fin top surface FT of each of the plurality of fin-type active regions FA and each of the device isolation film 112 and the inter-device isolation insulating film 114 (refer to FIG. 2B). The dummy gate insulating film D12 may include a silicon oxide film. The dummy gate line D14 may include a polysilicon film. The dummy insulating capping layer D16 may include a silicon nitride film.

Insulating spacers 120 may be formed on both sidewalls of the dummy gate structure DGS, and portions of the plurality of fin-type active regions FA, which are respectively exposed between the dummy gate structures DGS, may be etched, and thus, a plurality of recess regions RR may be respectively formed in the plurality of fin-type active regions FA.

Thereafter, a plurality of source/drain regions 130 may be respectively formed to fill the plurality of recess regions RR in the first device region RX1 and the second device region RX2. In example embodiments, to form the source/drain region 130, a low-pressure chemical vapor deposition (LPCVD) process, a selective epitaxial growth (SEG) process, or a cyclic deposition and etching (CDE) process may be performed using source materials including an element semiconductor precursor. In example embodiments, to form the source/drain region 130 including a silicon layer doped with an n-type dopant, silane ($SiH_4$), disilane ($Si_2H_6$), trisilane ($Si_3H_8$), and/or dichlorosilane ($SiH_2Cl_2$) may be used as a silicon source. The n-type dopant may be selected from phosphorus, arsenic, and antimony. In other example embodiments, to form the source/drain region 130 including a SiGe layer doped with a p-type dopant, a silicon source and a germanium source may be used. Silane ($SiH_4$), disilane ($Si_2H_6$), trisilane ($Si_3H_8$), and/or dichlorosilane ($SiH_2Cl_2$) may be used as the silicon source. Germane ($GeH_4$), digermane ($Ge_2H_6$), trigermane ($Ge_3H_8$), tetragermane ($Ge_4H_{10}$), and/or dichlorogermane ($Ge_2H_2Cl_2$) may be used as the Ge source. The p-type dopant may be selected from boron and gallium.

The process of forming the source/drain region 130 in the first device region RX1 and the process of forming the source/drain region 130 in the second device region RX2 may be sequentially performed. For example, forming the source/drain region 130 in the first device region RX1 may be followed by forming the source/drain region 130 in the second device region RX2. Alternatively, forming the source/drain region 130 in the second device region RX2 may be followed by forming the source/drain region 130 in the first device region RX1.

An insulating liner 146 and an inter-gate dielectric film 148 may be formed to sequentially cover the resultant structure in which the source/drain region 130 is formed in each of the first device region RX1 and the second device region RX2. The inter-gate dielectric film 148 may be formed to have a planarized top surface. After the inter-gate dielectric film 148 is formed, a top surface of the dummy insulating capping layer D16 may be exposed.

Figure 8C:
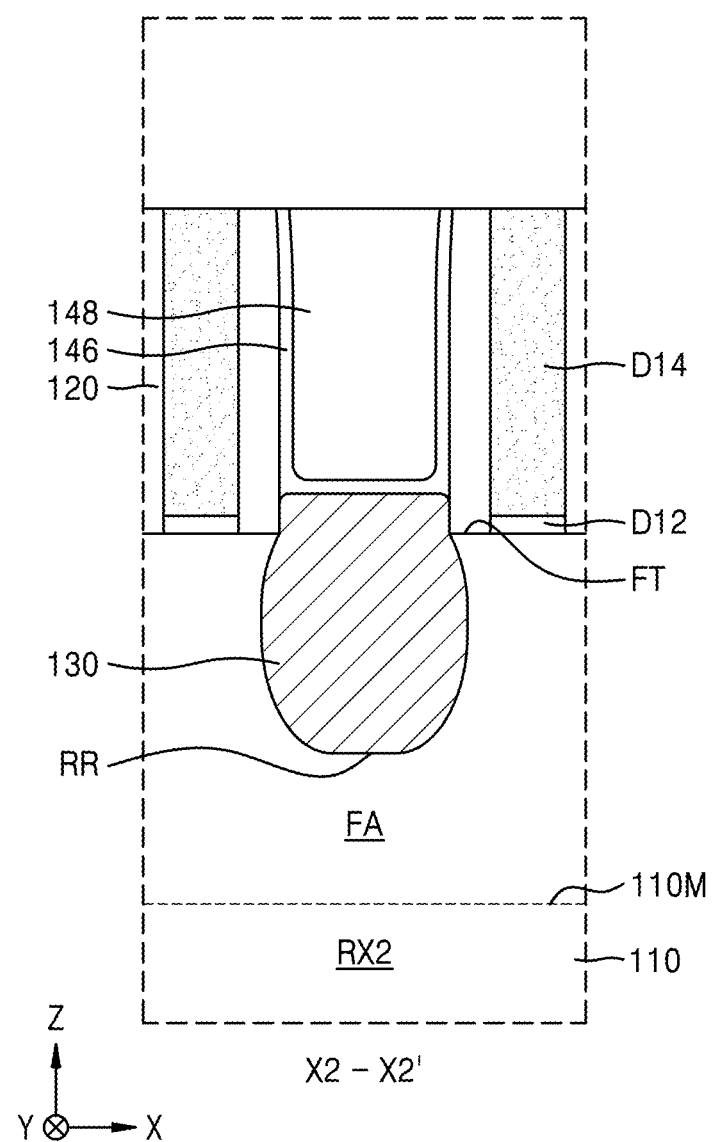

Referring to FIG. 8C, the dummy insulating capping layer D16 and insulating films adjacent thereto may be removed from the resultant structure of FIG. 8B by using a chemical mechanical polishing (CMP) process top expose a top surface of the dummy gate line D14. As a result, heights of the insulating liner 146, the inter-gate dielectric film 148, and the plurality of insulating spacers 120 may be reduced.

Figure 8D:
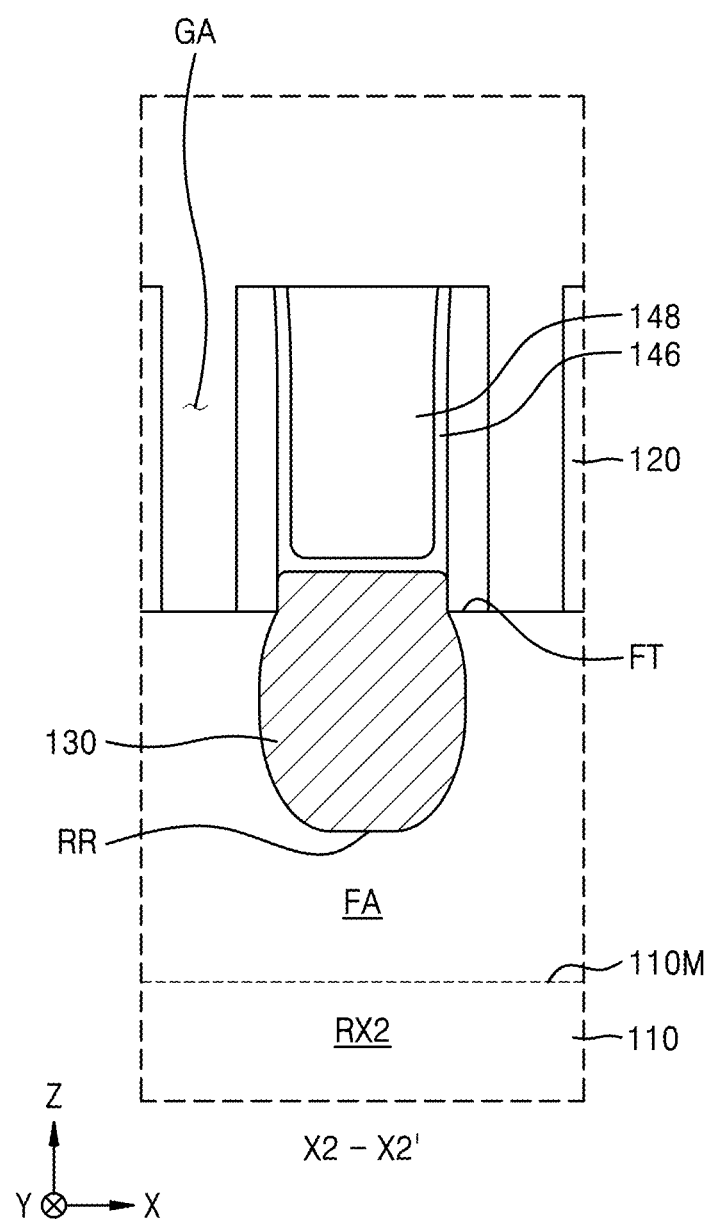

Referring to FIG. 8D, a plurality of dummy gate lines D14 and a plurality of dummy gate insulating films D12 may be removed from the resultant structure of FIG. 8C to provide a plurality of gate spaces GA. The insulating spacers 120, the plurality of fin-type active regions FA, the device isolation film 112, and the inter-device isolation insulating film 114 (refer to FIG. 2B) may be exposed through the plurality of gate spaces GA.

Figure 8E:
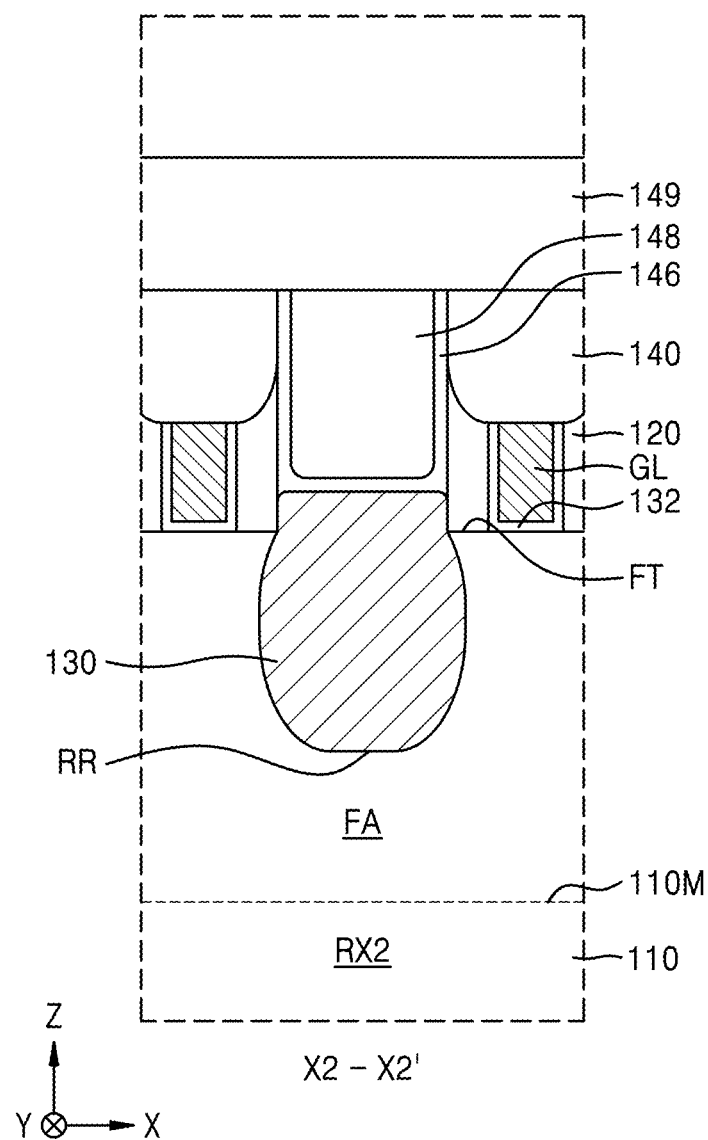

Referring to FIG. 8E, a gate insulating film 132, a gate line GL, and an insulating capping line 140 may be formed in each of the plurality of gate spaces GA in the resultant structure of FIG. 8D.

To form the gate insulating film 132, the gate line GL, and the insulating capping line 140, a plurality of gate insulating films 132 and a plurality of gate lines GL may be formed to fill the plurality of gate spaces GA, and then etched back such that the plurality of gate insulating films 132 and the plurality of gate lines GL fill only lower portions of the gate spaces GA, respectively. During the etchback process, an upper portion of the insulating spacer 120 may be removed together, and thus, a height of the insulating spacer 120 may be reduced.

Afterwards, in the plurality of gate spaces GA, a plurality of insulating capping lines 140 may be formed to cover a top surface of each of the gate lines GL, the gate insulating film 132, and the insulating spacers 120 and fill upper portions of the gate spaces GA. The insulating capping line 140 may be formed to have a planarized top surface. During the planarization of the top surface of the insulating capping line 140, respective upper portions of the insulating liner 146 and the inter-gate dielectric film 148 may be removed together, and thus, heights of the insulating liner 146 and the inter-gate dielectric film 148 may be reduced. Afterwards, an insulating film 149 may be formed to cover the top surface of each of the insulating capping line 140, the insulating liner 146, and the inter-gate dielectric film 148.

In example embodiments, before the gate insulating film 132 is formed, an interface film (not shown) may be formed to cover a surface of each of the plurality of fin-type active regions FA exposed through the plurality of gate spaces GA. To form the interface film, portions of the plurality of fin-type active regions FA exposed inside the plurality of gate spaces GA may be oxidized.

Figure 8F:
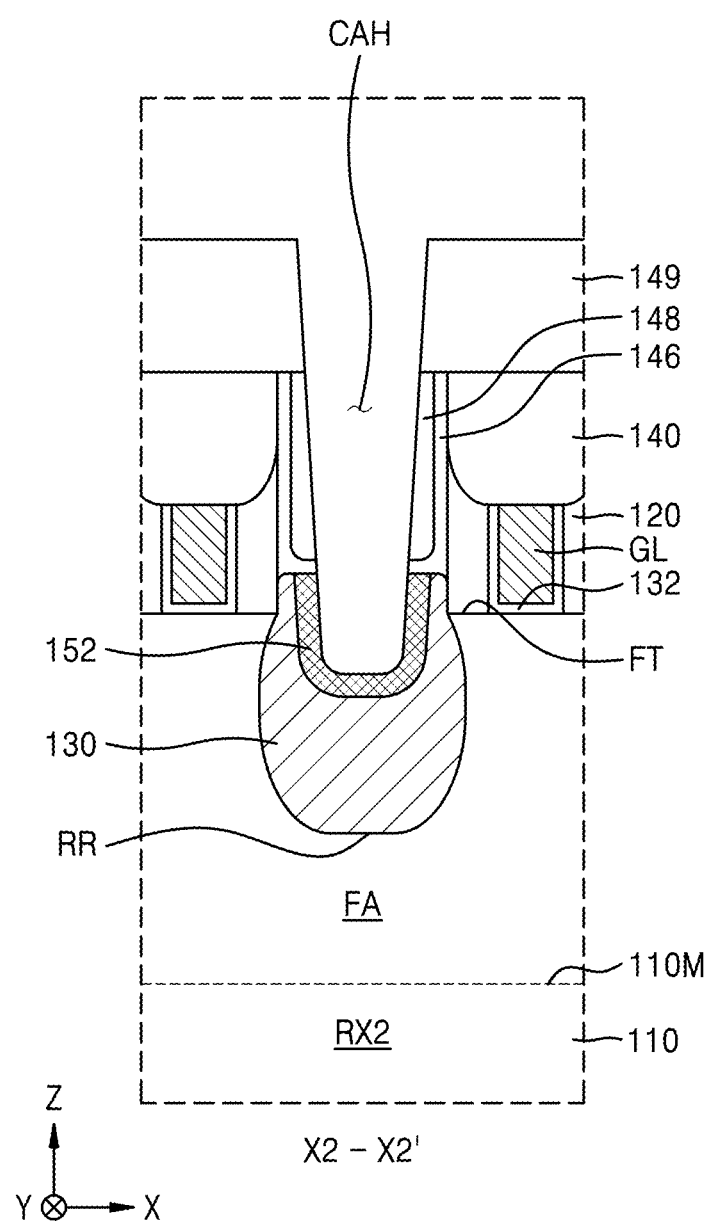

Referring to FIG. 8F, in the resultant structure of FIG. 8E, a source/drain contact hole CAH may be formed to pass through the insulating film 149 and the inter-gate dielectric film 148 and expose the source/drain region 130. After the source/drain region 130 is exposed through the source/drain contact hole CAH, a partial region of the source/drain region 130 may be removed using an anisotropic etching process through the source/drain contact hole CAH, and thus, the source/drain contact hole CAH may extend long toward the substrate 110. In example embodiments, the anisotropic etching process for forming the source/drain contact hole CAH may be performed using plasma.

After the source/drain contact hole CAH is formed, a metal silicide film 152 may be formed on the source/drain region 130, which is exposed at the bottom of the source/drain contact hole CAH. In example embodiments, the formation of the metal silicide film 152 may include forming a metal liner (not shown) to conformally cover an inner wall of the source/drain contact hole CAH and causing a reaction of the source/drain region 130 with a metal included in the metal liner by annealing the metal liner. After the metal silicide film 152 is formed, the remaining portion of the metal liner may be removed. A portion of the source/drain region 130 may be consumed during the formation of the metal silicide film 152. In example embodiments, when the metal silicide film 152 includes a titanium silicide film, the metal liner may include a titanium film.

Figure 8G:
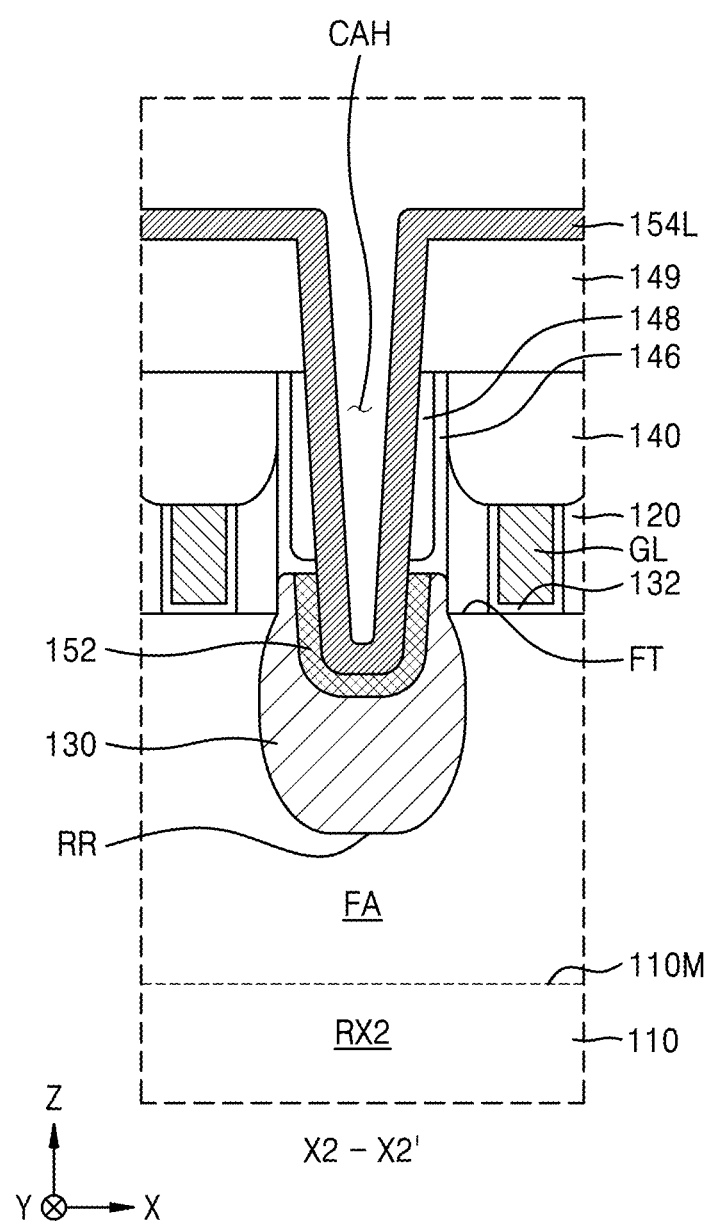

Referring to FIG. 8G, in the resultant structure of FIG. 8F, a conductive barrier film 154L may be formed to conformally cover surfaces exposed in an inner space of the source/drain contact hole CAH.

In example embodiments, the conductive barrier film 154L may be formed using an atomic layer deposition (ALD) process. The conductive barrier film 154L may be a preliminary barrier film required to form the conductive barrier pattern 154 shown in FIGS. 2A and 2C. The conductive barrier film 154L may be formed to have a thickness of about 1.5 times to about 3 times a target thickness of the conductive barrier pattern 154. By forming the conductive barrier film 154L using an ALD process to a thickness greater than a target thickness of the conductive barrier pattern 154, the conductive barrier film 154L having a dense structure without defects (e.g., pits) may be obtained as compared to the case of forming a conductive barrier film having a relatively small thickness corresponding to the target thickness of the conductive barrier pattern 154 using an ALD process.

Figure 8H:
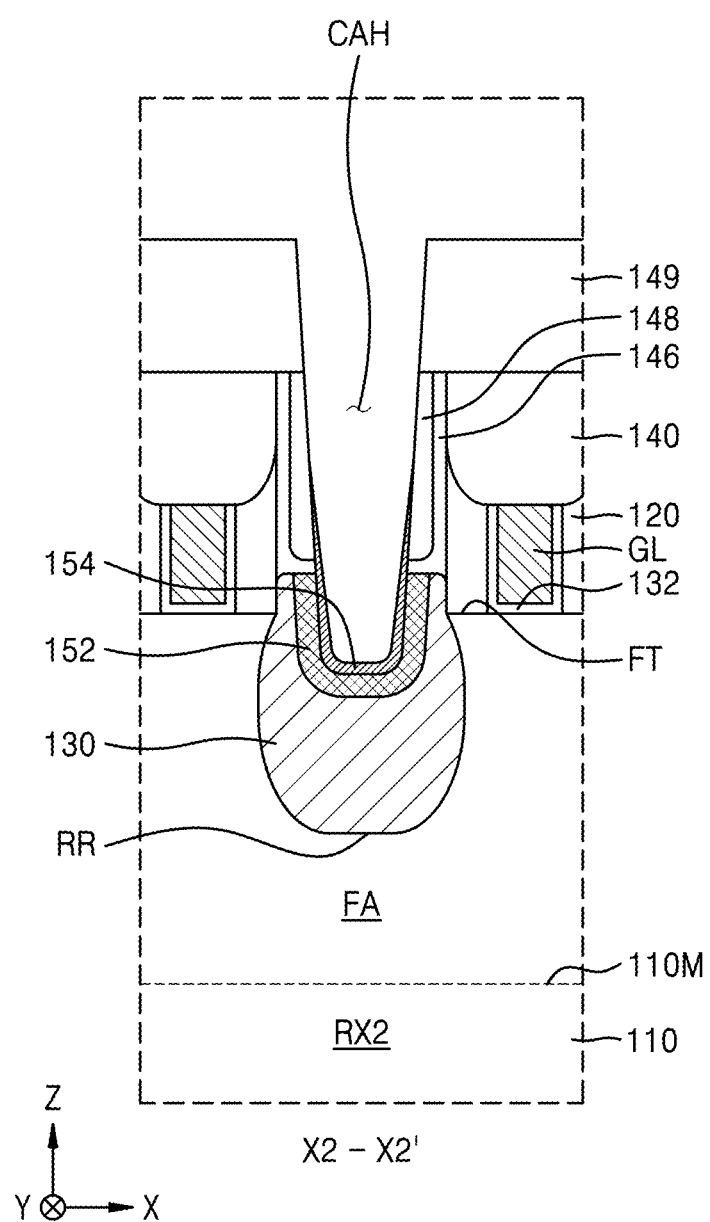

Referring to FIG. 8H, the conductive barrier film 154L may be etched back in the resultant structure of FIG. 8G, and thus, the conductive barrier pattern 154 may be formed from the conductive barrier film 154L.

In example embodiments, to etch back the conductive barrier film 154L, an etch gas capable of selectively etching the conductive barrier film 154L may be used. The process of etching back the conductive barrier film 154L using the etch gas may be performed in an atmosphere in which a bias voltage is not applied. The process of etching back the conductive barrier film 154L may be performed using the etch gas that is not excited to a plasma state.

In example embodiments, the process of etching back the conductive barrier film 154L may be performed at a temperature of about 100° C. to about 500° C., for example, a temperature of about 300° C. to about 450° C., without being limited thereto. In example embodiments, the process of etching back the conductive barrier film 154L may be performed under a pressure of about 10 Torr to about 600 Torr.

In example embodiments, when the conductive barrier film 154L includes a TiN film, the etch gas may include a halogen element-containing compound and $H_2$ gas. An etch rate of the conductive barrier film 154L may be controlled by controlling a relative content of each of the halogen element-containing compound and the $H_2$ gas included in the etch gas. In example embodiments, the halogen element-containing compound may be selected from $MoCl_3$, $MoCl_5$, $MoOCl_4$, $MoCl_6$, $MoO_2Cl_2$, $MoOCl_4$, $WCl_6$, $WCl_5$, $WCl_4$, $CHF_3$, $BCl_3$, $Cl_2$, and a combination thereof, without being limited thereto.

In example embodiments, the etch gas used during the process of etching back the conductive barrier film 154L may include the same compound as a metal precursor required for a subsequent process of forming a conductive plug 156. For example, when the conductive plug 156 includes Mo, the etch gas used during the process of etching back the conductive barrier film 154L may include a Mo-containing compound, for example, $MoCl_3$, $MoCl_5$, $MoOCl_4$, $MoCl_6$, $MoO_2Cl_2$, $MoOCl_4$, or a combination thereof.

As described above with reference to FIGS. 8G and 8H, the conductive barrier film 154L having a relatively dense structure and a relatively great thickness may be formed and then etched back to form the conductive barrier pattern 154. Thus, even when the conductive barrier pattern 154 having a relatively small thickness of about 1 nm or less is formed, the conductive barrier pattern 154 having a dense and uniform structure without defects (e.g., pits) may be obtained.

Figure 8I:
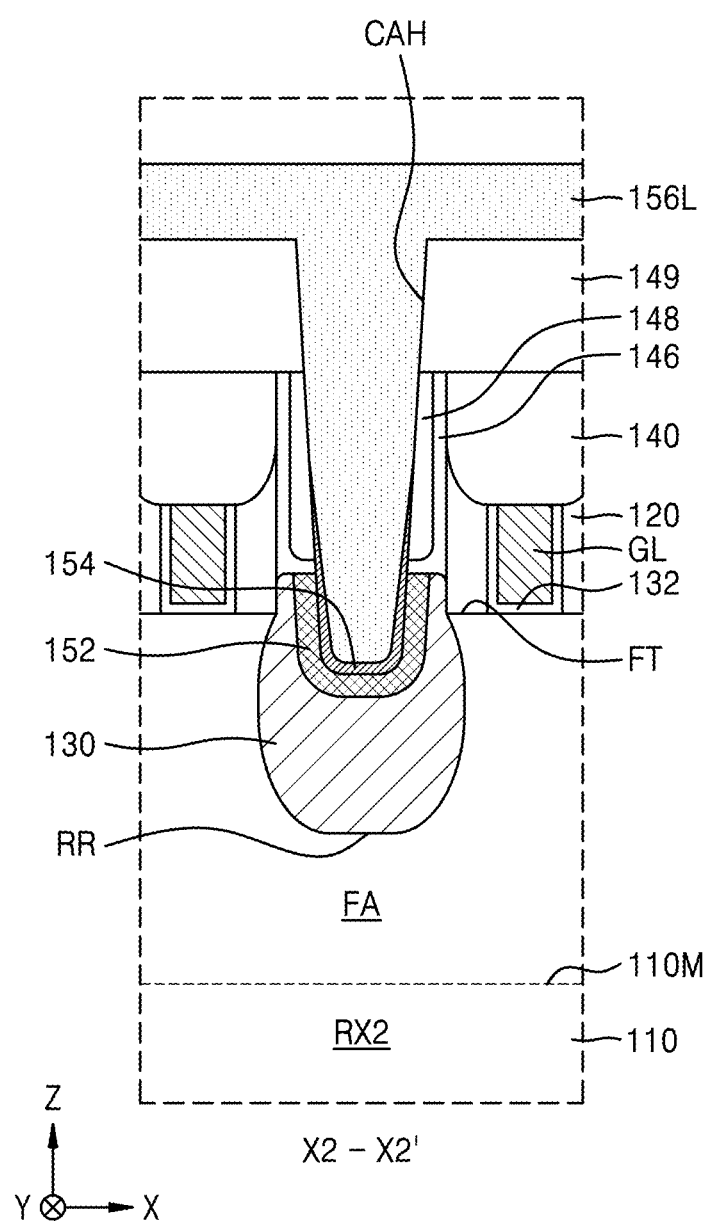

Referring to FIG. 8I, in the resultant structure of FIG. 8H, a metal-containing film 156L may be formed to fill a space of the source/drain contact hole CAH on the conductive barrier pattern 154. The metal-containing film 156L may be formed to fill the source/drain contact hole CAH and cover a top surface of the insulating film 149.

The metal-containing film 156L may include a metal selected from molybdenum (Mo), copper (Cu), tungsten (W), cobalt (Co), ruthenium (Ru), manganese (Mn), titanium (Ti), tantalum (Ta), aluminum (Al), and a combination thereof.

In example embodiments, the metal-containing film 156L may include a molybdenum (Mo) film. In this case, the metal-containing film 156L may be formed by means of an ALD process or a chemical vapor deposition (CVD) process using a molybdenum precursor. When the metal-containing film 156L includes a molybdenum film, the molybdenum precursor may be selected from $MoCl_3$, $MoCl_5$, $MoOCl_4$, $MoCl_6$, $Mo(CO)_6$, $MoO_2Cl_2$, $MoOCl_4$, $MoF_6$, an organic molybdenum compound, and a combination thereof. In example embodiments, the organic molybdenum compound may be selected from molybdenum acetylacetonate, biscyclopentadienyl molybdenum dihydride, bismethylcyclopentadienyl molybdenum dihydride, bisethylcyclopentadienyl molybdenum dihydride, bisisopropyl cyclopentadienyl molybdenum dihydride, biscyclopentadienyl imide molybdenum, and a combination thereof. However, types of molybdenum precursor that may be used to form the metal-containing film 156L are not limited to the examples described above.

Figure 8J:
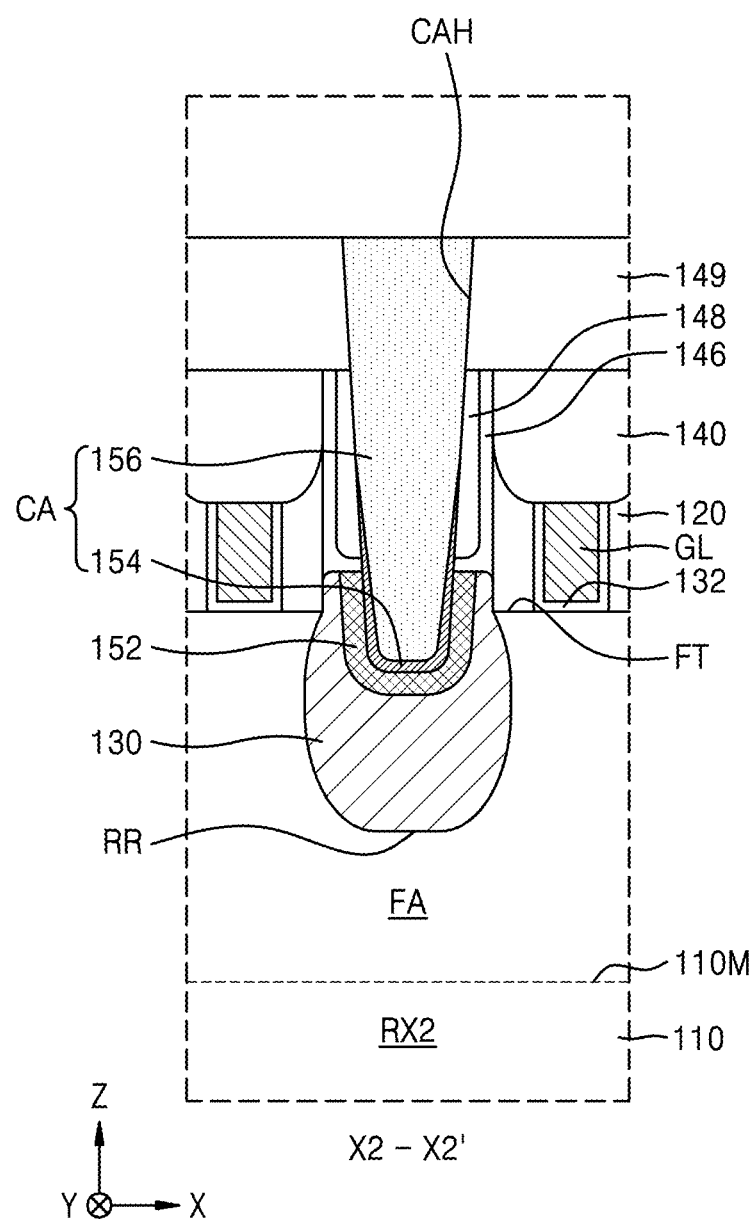

Referring to FIG. 8J, in the resultant structure of FIG. 8I, a portion of the metal-containing film 156L, which is outside the source/drain contact hole CAH, may be removed using a CMP process to expose the top surface of the insulating film 149. As a result, the conductive plug 156 may be obtained from the metal-containing film 156L, and a source/drain contact CA including the conductive barrier pattern 154 and the conductive plug 156 may be formed inside the source/drain contact hole CAH.

Thereafter, as shown in FIGS. 2A and 2B, an etch stop film 182 and an interlayer insulating film 184 may be sequentially formed on the resultant structure of FIG. 8J to form an upper insulating structure 180. A plurality of via contacts CAV may be respectively formed to be connected to the source/drain contacts CA, and a plurality of gate contacts CB may be respectively formed to be connected to the plurality of gate lines GL. Thus, the IC device 100 described with reference to FIGS. 1 and 2A to 2C may be manufactured.

In example embodiments, to form the plurality of gate contacts CB, processes similar to the processes of forming the source/drain contact CA, which has been described with reference to FIGS. 8G to 8J, may be performed.

FIGS. 9A to 16 are cross-sectional views of a process sequence of a method of manufacturing an IC device, according to example embodiments, wherein FIGS. 9A, 10A, 11A, 12A, 13A, 14A, 15, and 16 are cross-sectional views of a portion corresponding to a cross-section taken along line X4-X4' of FIG. 6, according to the process sequence, and FIGS. 9B, 10B, 11B, 12B, 13B, and 14B are cross-sectional views of a portion corresponding to a cross-section taken along line Y4-Y4' of FIG. 6. A method of manufacturing the IC device 400 shown in FIGS. 6. 7A, and 7B, according to an example embodiment, will be described with reference to FIGS. 9A to 16. In FIGS. 9A to 16, the same reference numerals are used to denote the same elements as in FIGS. 6, 7A, and 7B, and detailed descriptions thereof are omitted.

Figure 9A:
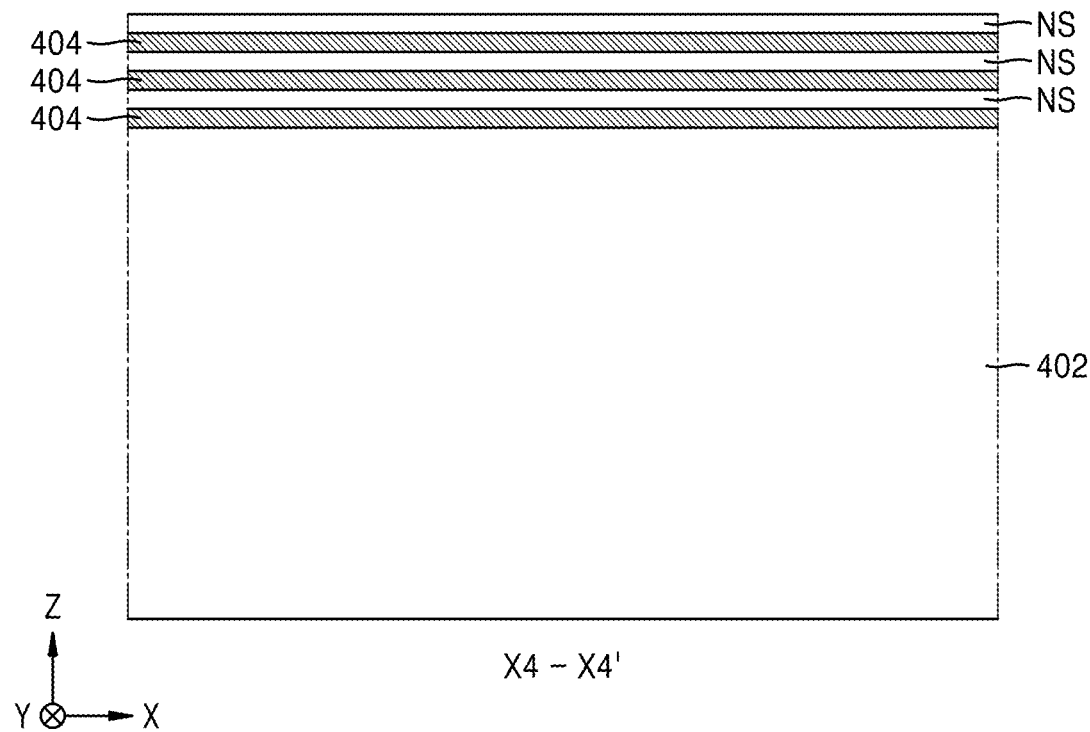
Figure 9B:
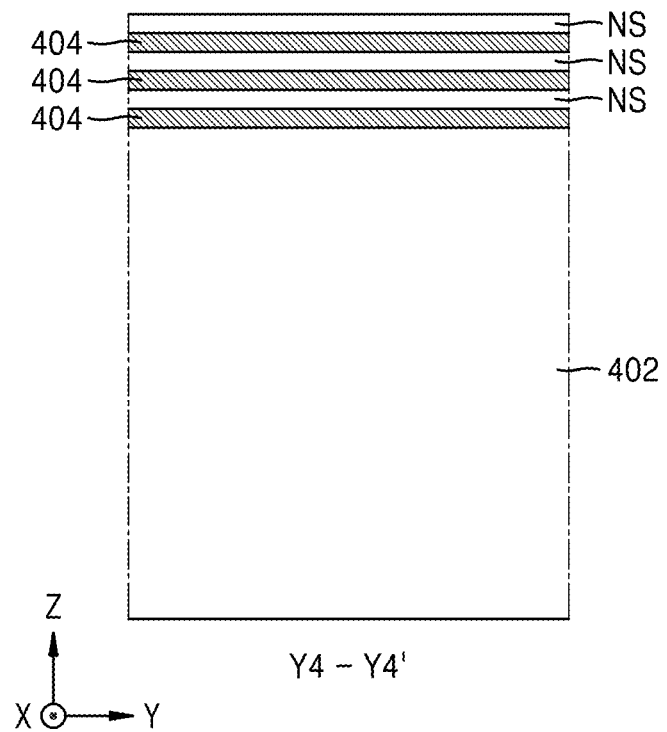
FIGS. 9B, 10B, 11B, 12B, 13B, and 14B are cross-sectional views of a portion corresponding to a cross-section taken along line Y4-Y4' of FIG. 6.

Referring to FIGS. 9A and 9B, a plurality of sacrificial semiconductor layers 404 and a plurality of nanosheet semiconductor layers NS may be alternately stacked one by one on a substrate 402. The plurality of sacrificial semiconductor layers 404 may include a different semiconductor material from the plurality of nanosheet semiconductor layers NS. In example embodiments, the plurality of sacrificial semiconductor layers 404 may include silicon germanium (SiGe), and the plurality of nanosheet semiconductor layers NS may include silicon.

Figure 10A:
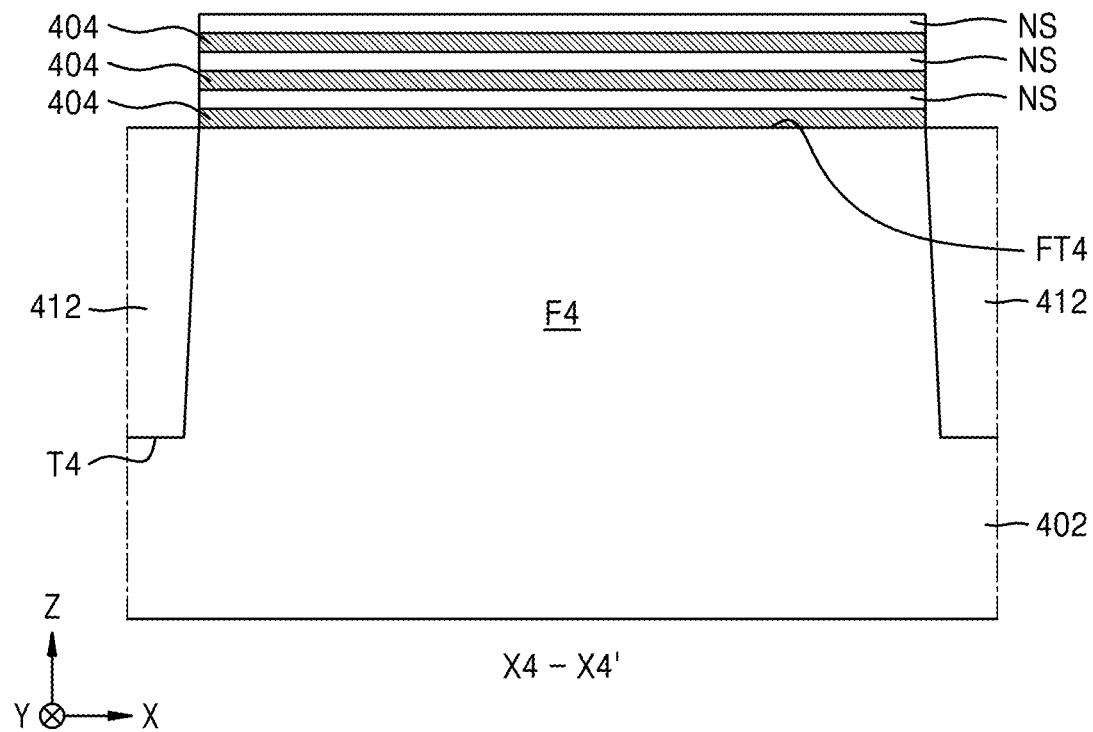
Figure 10B:
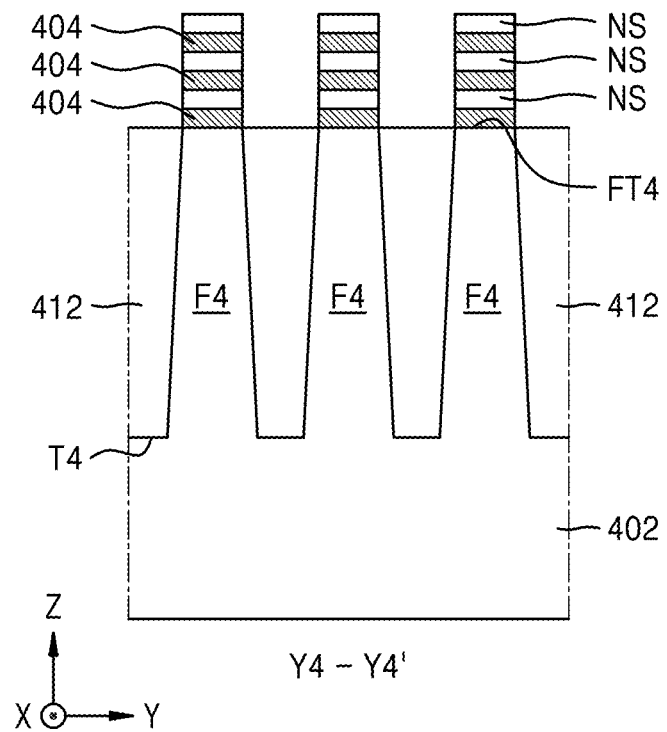

Referring to FIGS. 10A and 10B, the plurality of sacrificial semiconductor layers 404, the plurality of nanosheet semiconductor layers NS, and the substrate 402 may be partially etched to form trenches T4, and a device isolation film 412 may be formed inside the trenches T4. As a result, fin-type active regions F4 may be defined by the trenches T4, respectively. Stack structures of the plurality of sacrificial semiconductor layers 404 and the plurality of nanosheet semiconductor layers NS may remain on top surfaces FT4 of the fin-type active regions F4, respectively.

Figure 11A:
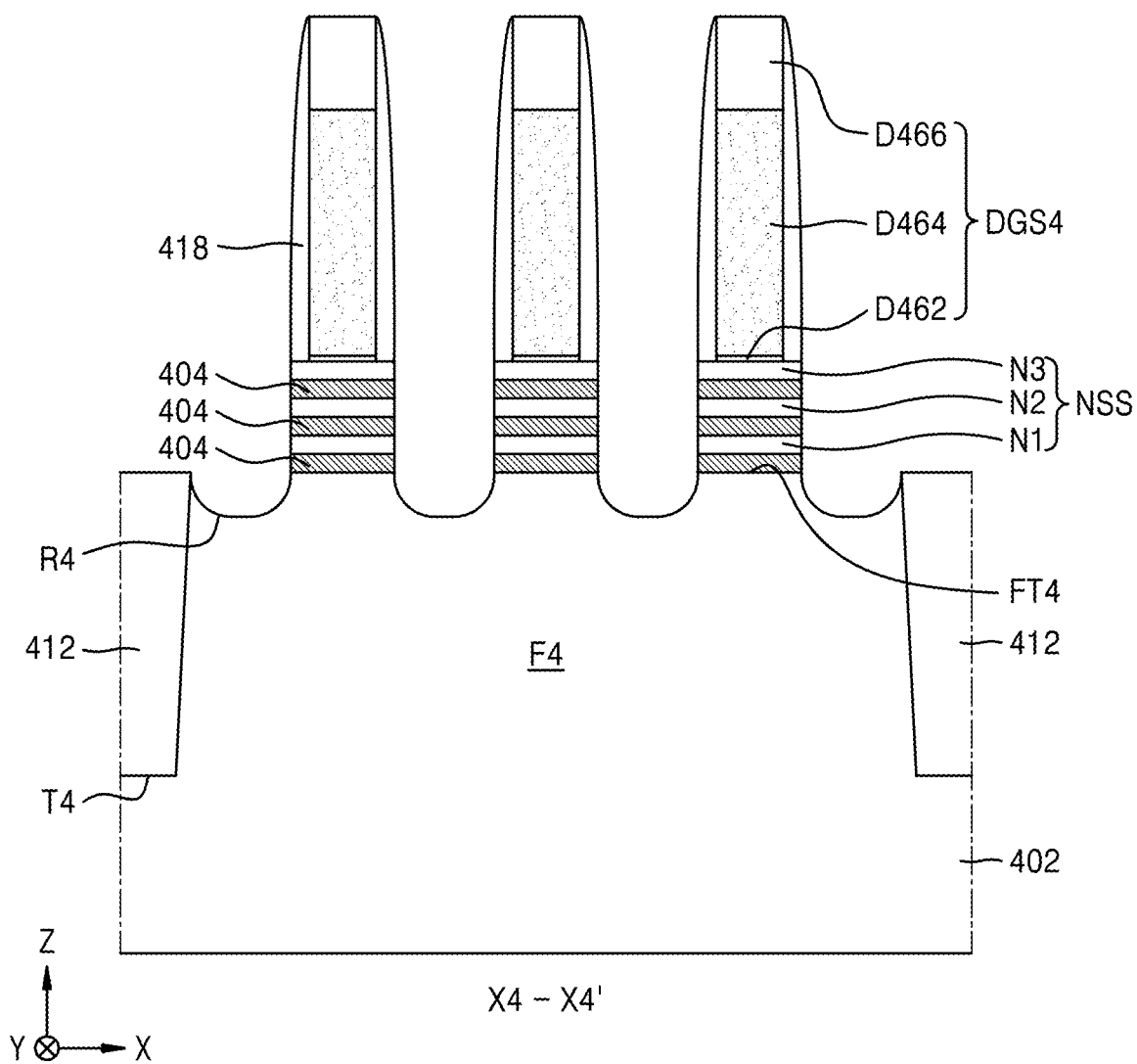
Figure 11B:
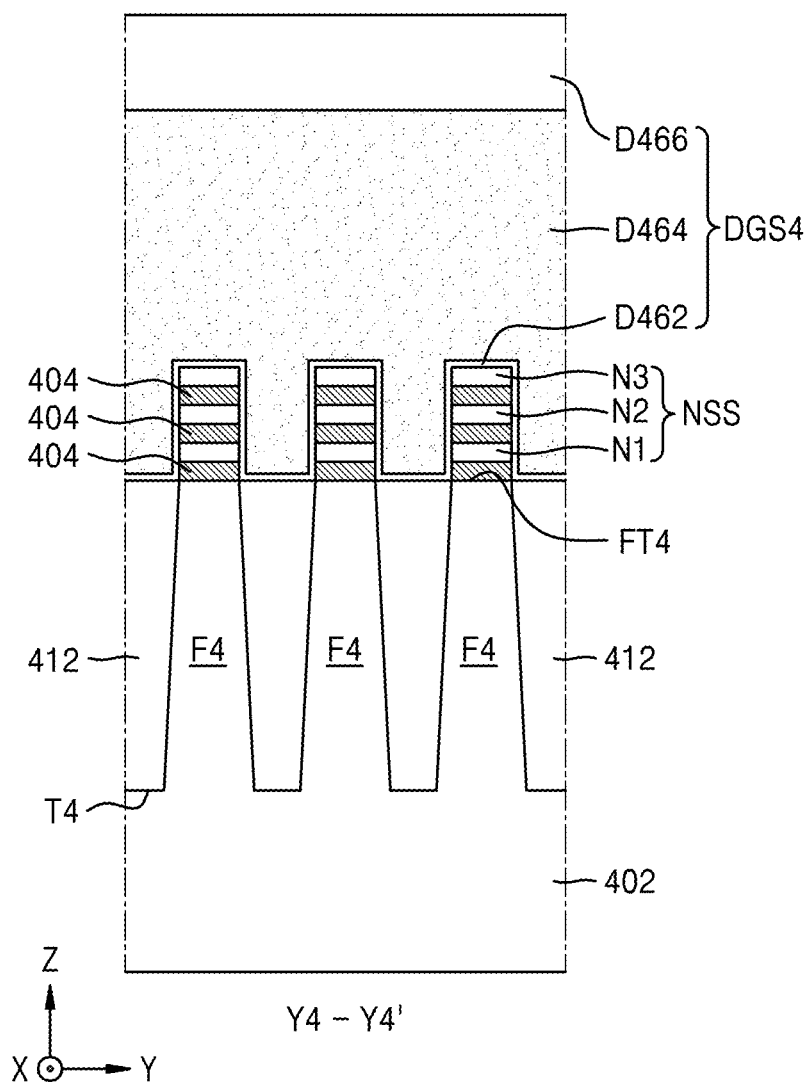

Referring to FIGS. 11A and 11B, in the resultant structure of FIGS. 10A and 10B, a plurality of dummy gate structures DGS4 may be formed on the stack structures of the plurality of sacrificial semiconductor layers 404 and the plurality of nanosheet semiconductor layers NS, and a plurality of outer insulating spacers 418 may be formed to cover both sidewalls of the plurality of dummy gate structures DGS4, respectively. Afterwards, the plurality of sacrificial semiconductor layers 404 and the plurality of nanosheet semiconductor layers NS may be partially etched using the plurality of dummy gate structures DGS4 and the plurality of outer insulating spacers 418 as etch masks, respectively, and thus, the plurality of nanosheet semiconductor layers NS may be divided into a plurality of nanosheet stacks NSS including first to third nanosheets N1, N2, and N3. Thereafter, the fin-type active regions F4 exposed between the plurality of nanosheet stacks NSS may be etched, and thus, a plurality of recess regions R4 may be formed in upper portions of the fin-type active region F4.

Each of the plurality of dummy gate structures DGS4 may extend long in the second lateral direction (Y direction). Each of the plurality of dummy gate structures DGS4 may have a structure in which an insulating layer D462, a dummy gate layer D464, and a capping layer D466 are sequentially stacked. In example embodiments, the insulating layer D462 may include silicon oxide, the dummy gate layer D464 may include polysilicon, and the capping layer D466 may include silicon nitride.

Figure 12A:
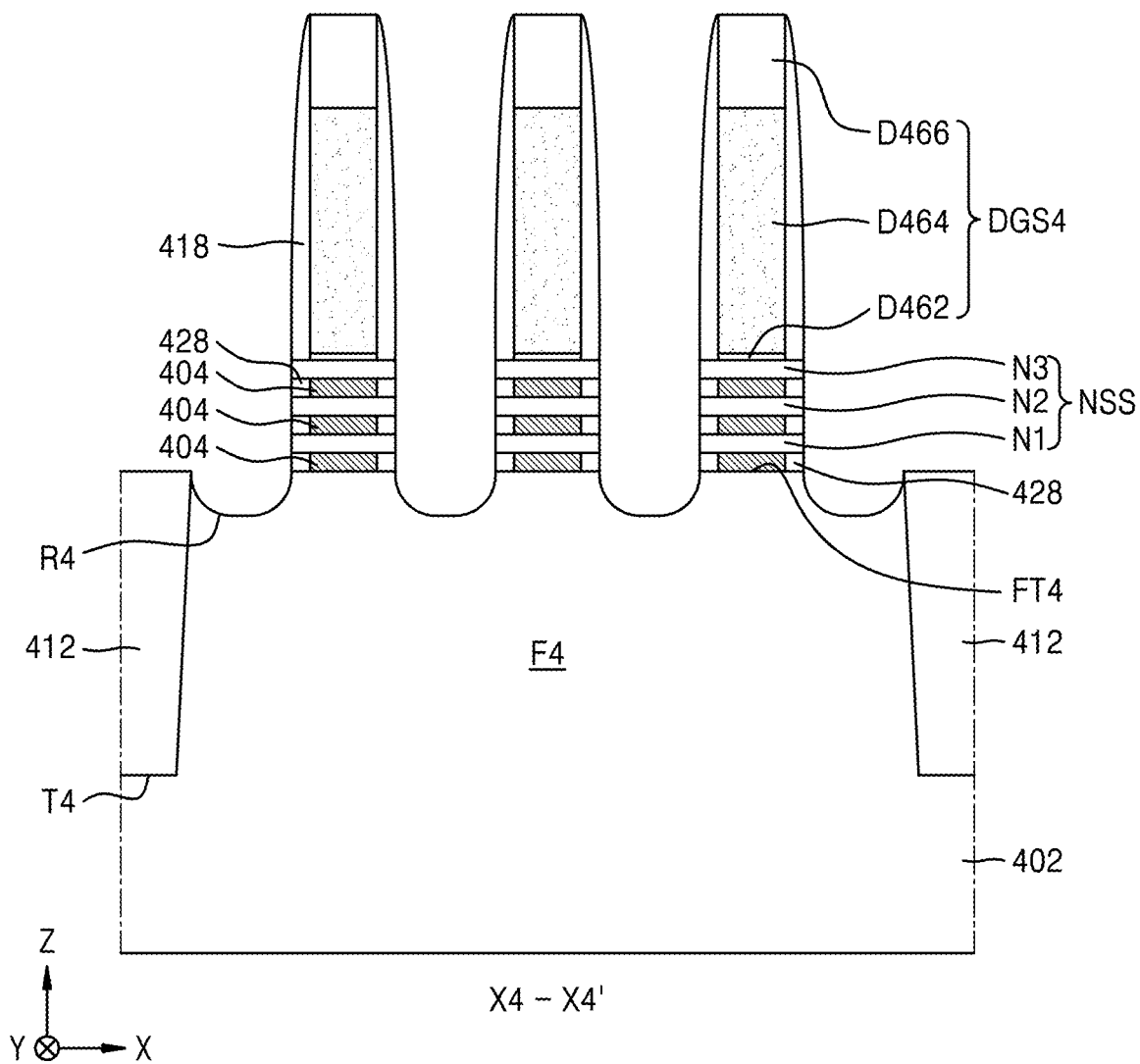
Figure 12B:
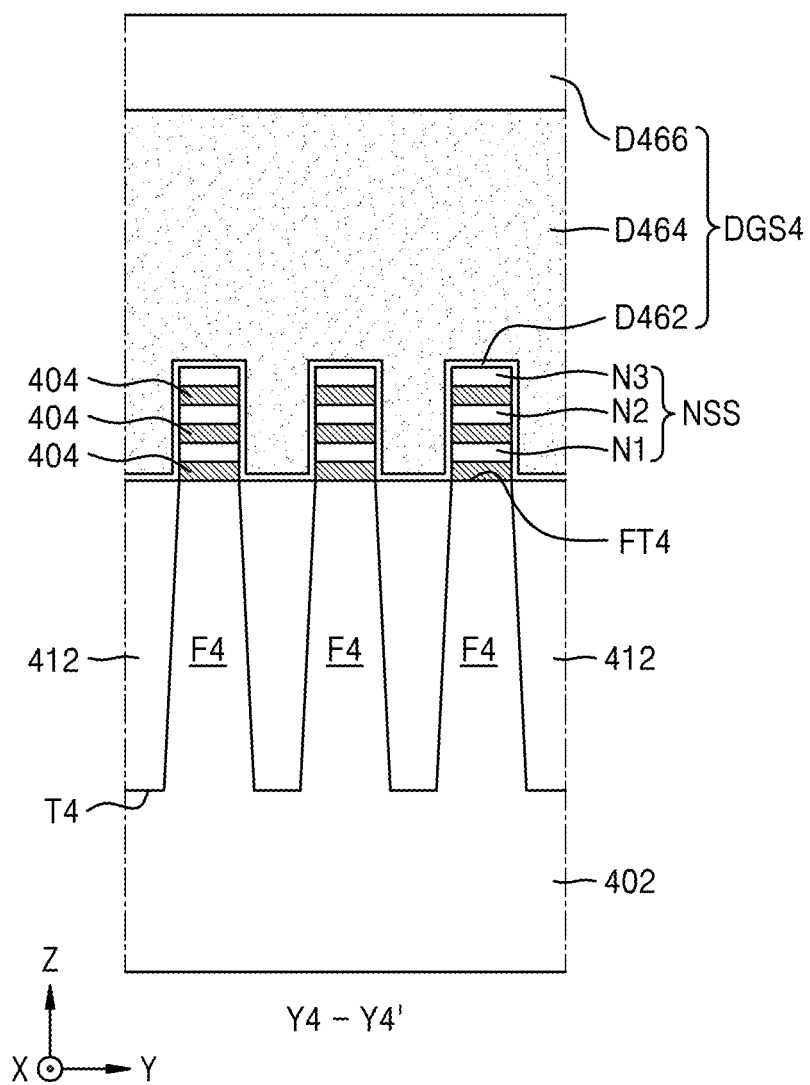

Referring to FIGS. 12A and 12B, respective portions of the plurality of sacrificial semiconductor layers 404 exposed around the plurality of recess regions R4 may be removed from the resultant structure of FIGS. 11A and 11B, and thus, a plurality of indent regions may be formed between the first to third nanosheets N1, N2, and N3 and between the first nanosheet N1 and the top surface FT4 of the fin-type active region F4. Thereafter, a plurality of inner insulating spacers 428 may be formed to fill the plurality of indent regions.

Figure 13A:
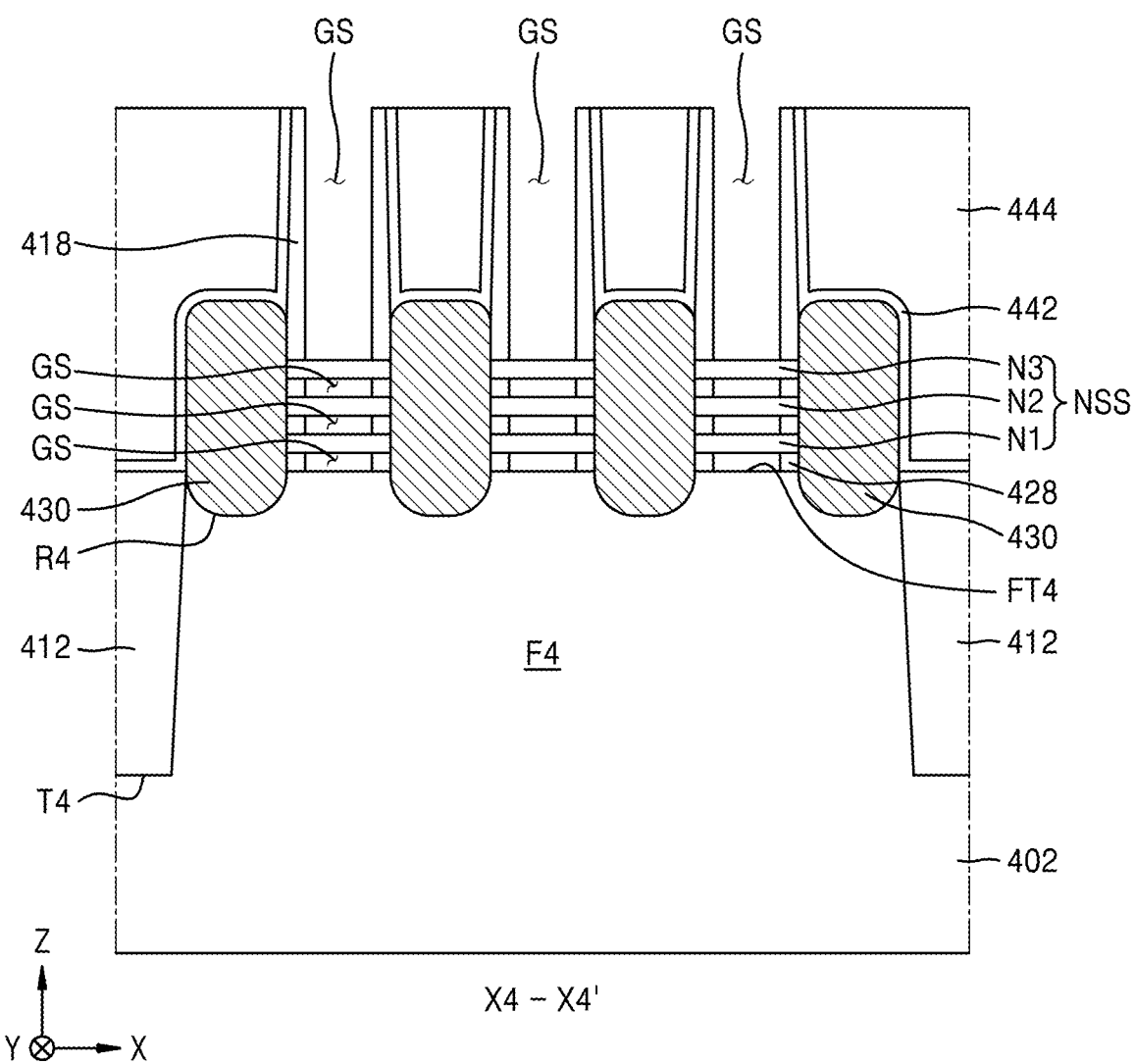
Figure 13B:
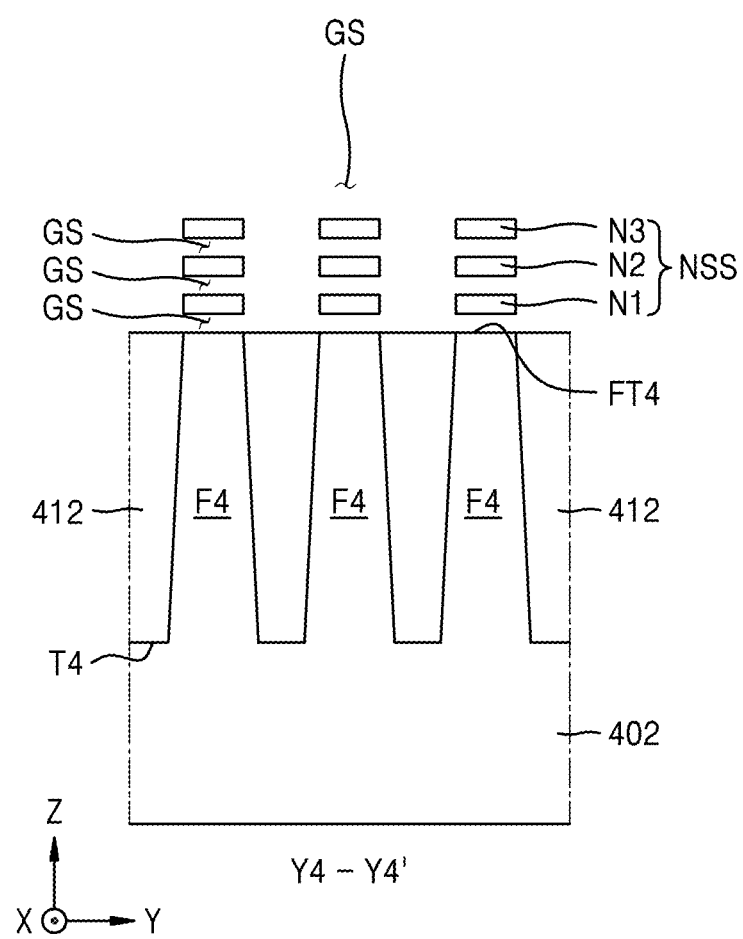

Referring to FIGS. 13A and 13B, in the resultant structure of FIGS. 12A and 12B, a semiconductor material may be epitaxially grown from respective exposed surfaces of the plurality of recess regions R4 and respective exposed surfaces of the first to third nanosheets N1, N2, and N3 to form a plurality of source/drain regions 430. Thereafter, an insulating liner 442 may be formed to cover the resultant structure including the plurality of source/drain regions 430, and an inter-gate dielectric film 444 may be formed on the insulating liner 442. Next, a top surface of each of the insulating liner 442 and the inter-gate dielectric film 444 may be planarized to expose a top surface of the capping layer D466 (refer to FIGS. 12A and 12B).

Thereafter, a plurality of gate spaces GS may be prepared by removing the plurality of dummy gate structures DGS4 shown in FIGS. 12A and 12B. The plurality of sacrificial semiconductor layers 404 may be removed through the gate spaces GS, and thus, the gate spaces GS may extend to respective spaces between the first to third nanosheets N1, N2, and N3 and a space between the first nanosheet N1 and the top surface FT4 of the fin-type active region F4.

Figure 14A:
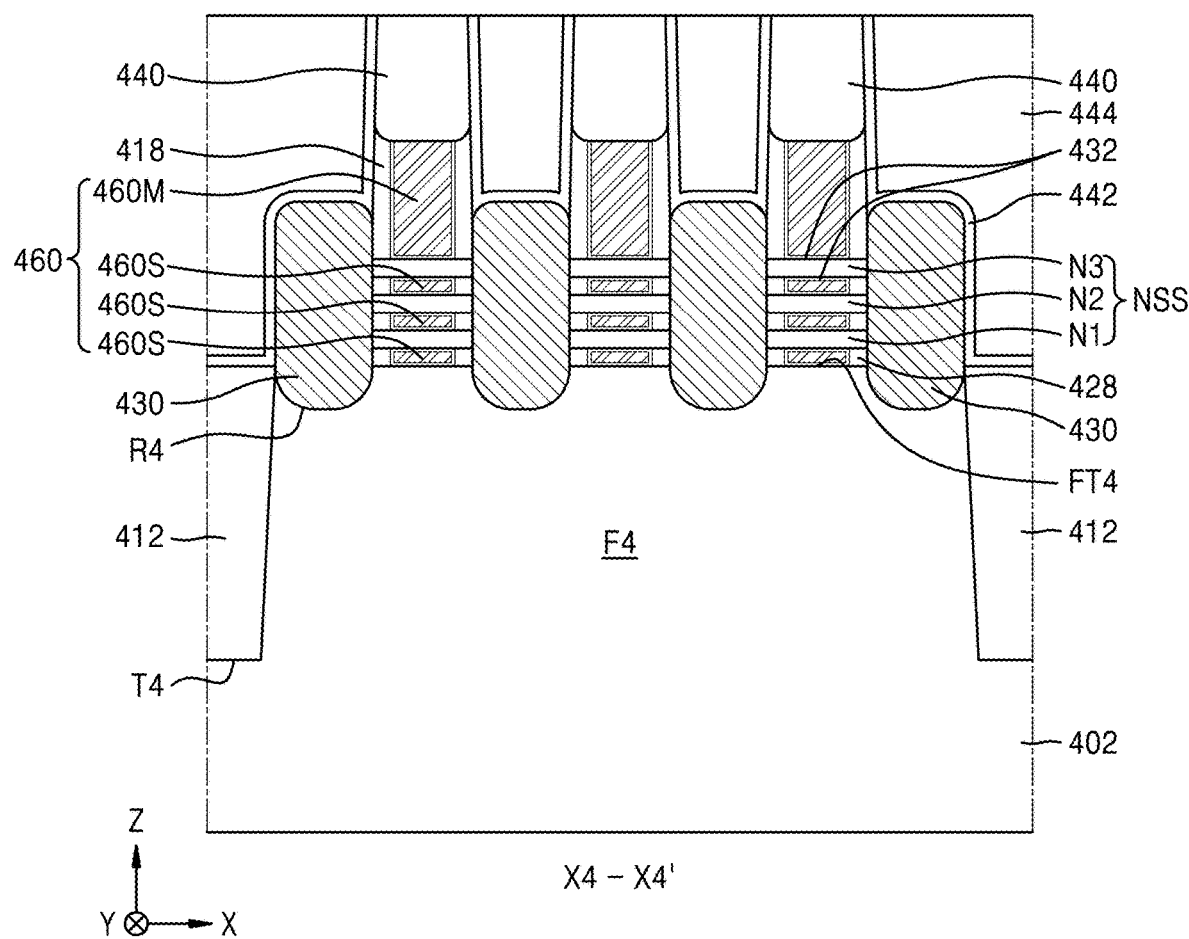
Figure 14B:
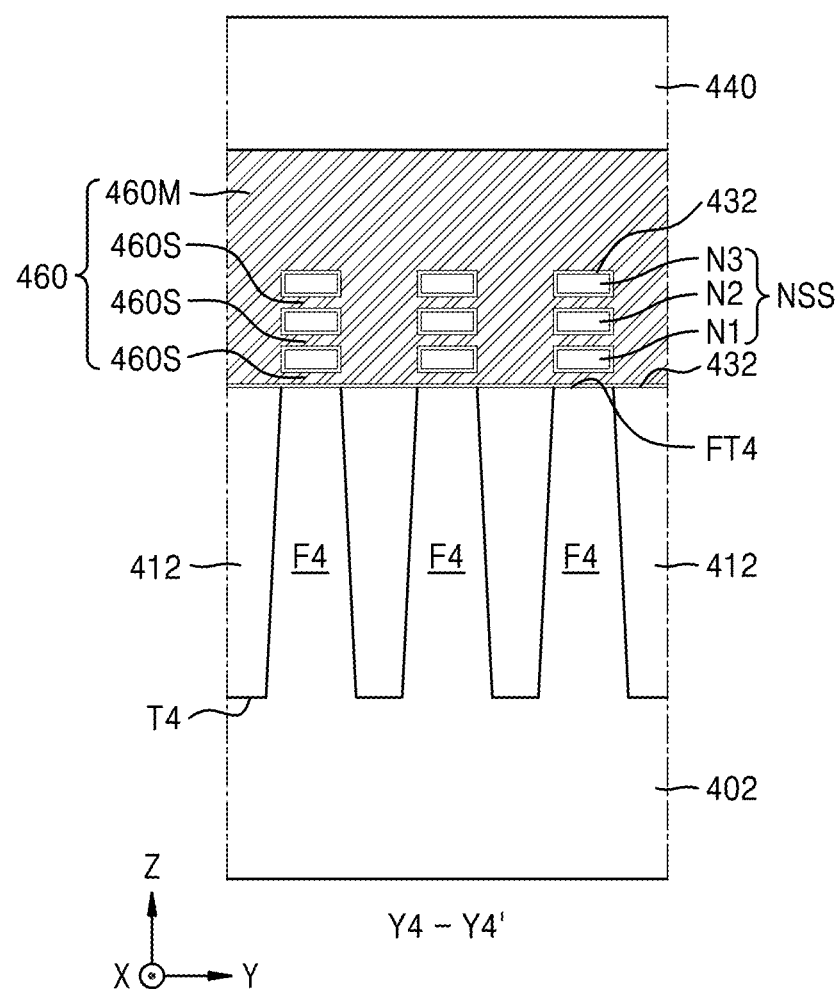

Referring to FIGS. 14A and 14B, a gate insulating film 432 may be formed to cover the exposed surfaces of the first to third nanosheets N1, N2, and N3 and the fin-type active region F4. A plurality of gate lines 460 may be formed on the gate insulating film 432 to fill the gate spaces GS. Thereafter, respective upper portions of the plurality of gate lines 460 and respective upper portions of the gate insulating film 432 and the plurality of outer insulating spacers 418, which are adjacent to the upper portions of the plurality of gate lines 460, may be removed to empty respective upper spaces of the plurality of gate spaces GS. Afterwards, the upper space of each of the plurality of gate spaces GS may be filled with the insulating capping line 440. By performing the planarization process during the formation of the plurality of gate lines 460 and the insulating capping line 440, a height of each of the insulating liner 442 and the inter-gate dielectric film 444 may be reduced.

Figure 15:
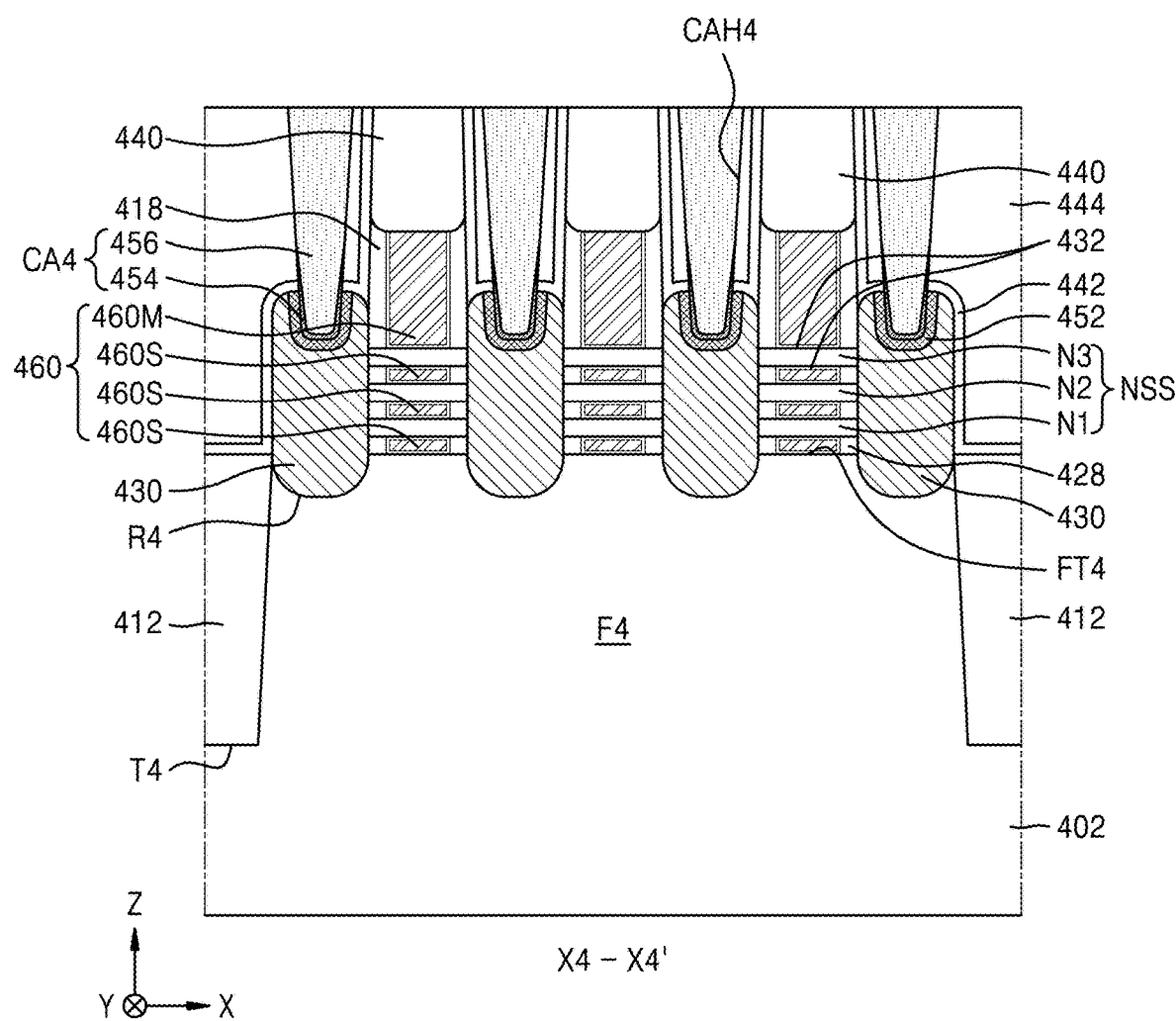

Referring to FIG. 15, the inter-gate dielectric film 444 and the insulating liner 442 may be partially etched to form a plurality of source/drain contact holes CAH4 exposing the plurality of source/drain regions 430. Thereafter, a partial region of each of the source/drain regions 430 may be removed using an anisotropic etching process through the source/drain contact hole CAH4, and thus, the source/drain contact hole CAH4 may extend long toward the substrate 402.

Thereafter, a metal silicide film 552 may be formed on the source/drain region 430, which is exposed at the bottom of the source/drain hole CAH4, by using a method similar to the process of forming the metal silicide film 152, which has been described with reference to FIG. 8F. A conductive barrier pattern 454 and a conductive plug 456 may be sequentially formed inside the source/drain contact hole CAH4 by using a method similar to the process of forming the source/drain contact CA, which has been described with reference to FIGS. 8A to 8J, and thus, a source/drain contact CA4 may be formed.

Figure 16:
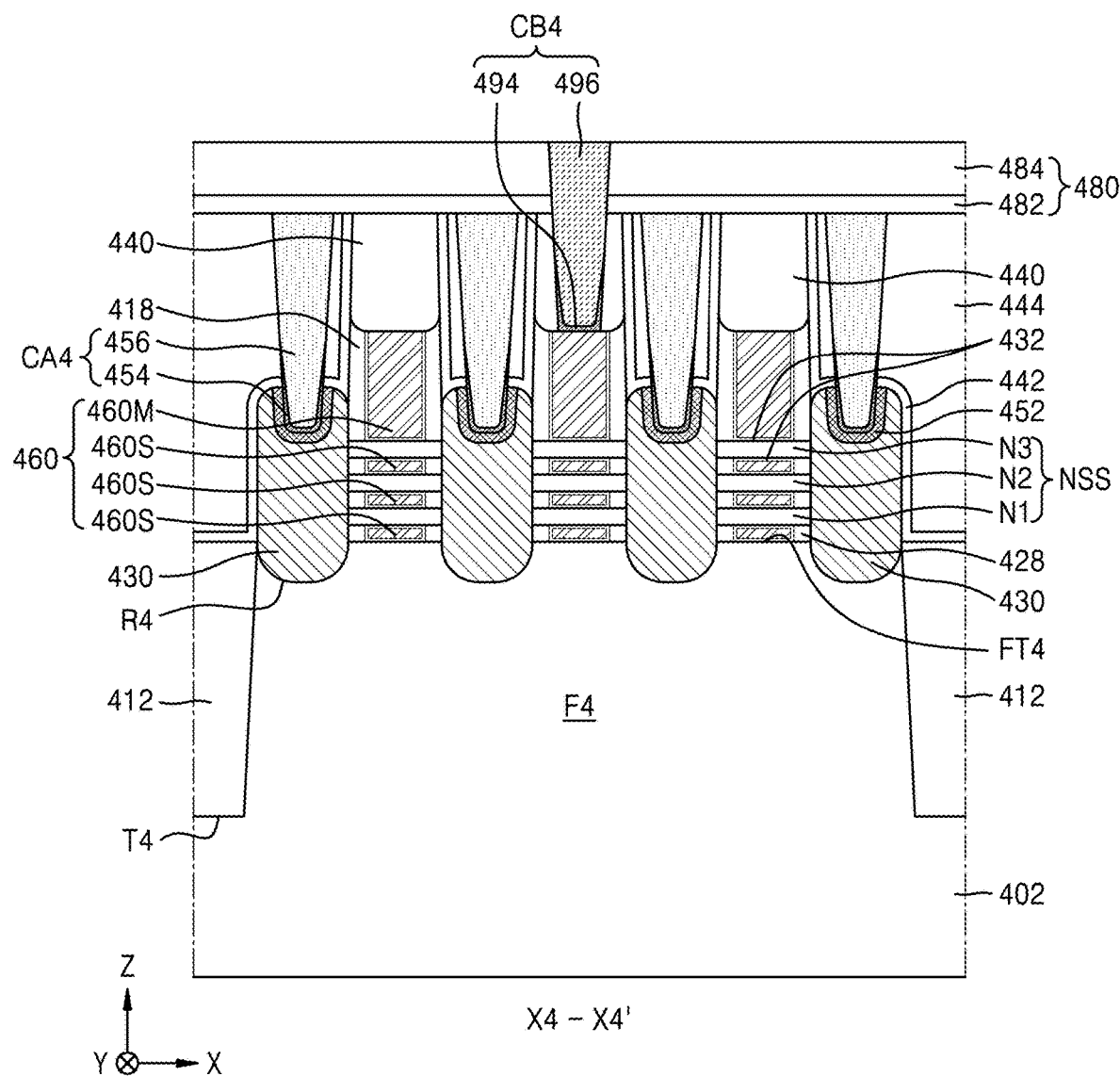

Referring to FIG. 16, an etch stop film 482 and an interlayer insulating film 484 may be formed to sequentially cover the resultant structure of FIG. 15 to form an upper insulating structure 480, and a gate contact CB4 may be formed to be connected to the gate line 460. To form the gate contact CB4, processes similar to the process of forming the source/drain contact CA, which has been described with reference to FIGS. 8G to 8J, may be performed.

In addition, as shown in FIG. 6, a plurality of source/drain via contacts CAV4 may be formed to be connected to the plurality of source/drain contacts CA4, respectively. In example embodiments, the plurality of source/drain via contacts CAV4 may be formed simultaneously with the plurality of gate contacts CB4. In other example embodiments, the plurality of source/drain via contacts CAV4 and the plurality of gate contacts CB4 may be sequentially formed using separate processes. In this case, forming the plurality of source/drain via contacts CAV4 may be followed by forming the plurality of gate contacts CB4. Alternatively, forming the plurality of gate contacts CB4 may be followed by following the plurality of source/drain via contacts CAV4.

Although the method of manufacturing the IC device 100 shown in FIGS. 1 and 2A to 2C and the method of manufacturing the IC device 400 shown in FIGS. 6, 7A, and 7B have been described with reference to FIGS. 8A to 16, it will be understood that the IC device 200 shown in FIG. 3, the IC device 300A shown in FIG. 4, and the IC device 300B shown in FIG. 5, and IC devices having various other structures may be manufactured by making various modifications and changes within the scope of the inventive concept with reference to the above description.

While the inventive concept has been particularly shown and described with reference to example embodiments thereof, it will be understood that various changes in form and details may be made therein without departing from the spirit and scope of the following claims.

What is claimed is:

1. An integrated circuit device comprising:
a conductive region on a substrate, the conductive region a first metal;
an insulating film on the conductive region;
a first conductive plug passing through the insulating film and extending in a vertical direction, the first conductive plug including a second metal; and
a conductive barrier pattern between the conductive region and the first conductive plug, the conductive barrier pattern having a first surface in contact with the conductive region and a second surface in contact with the first conductive plug, wherein
a bottom surface and a lower sidewall of the first conductive plug are in contact with the conductive barrier pattern, and an upper sidewall of the first conductive plug is in contact with the insulating film,
the conductive barrier pattern includes a vertical barrier portion between the insulating film and the first conductive plug and a trough portion connected to the vertical barrier portion,
the trough portion has a shape such that the first surface of the trough portion is convex and the second surface of the trough portion is concave, and
the vertical barrier portion has a shape with a width of the shape of the vertical barrier portion in a lateral direction tapering along a first direction away from the conductive region such that the vertical barrier portion tapers to end at a position corresponding to a junction of the lower sidewall and the upper sidewall of the first conductive plug.

2. The integrated circuit device of claim 1, wherein the vertical barrier portion of the conductive barrier pattern has a ring shape surrounding the first conductive plug.

3. The integrated circuit device of claim 1, wherein the vertical barrier portion of the conductive barrier pattern has a tapered surface facing the first conductive plug, and
a distance between the tapered surface and the insulating film decreases along the first direction away from the conductive region.

4. The integrated circuit device of claim 1, wherein the conductive region includes a metal silicide film including the first metal.

5. The integrated circuit device of claim 1, wherein the conductive barrier pattern includes a third metal, and the second metal includes a different element from the third metal.

6. The integrated circuit device of claim 1, wherein the conductive barrier pattern has a thickness greater than 0 nm and equal to or less than 1 nm between the conductive region and the first conductive plug.

7. The integrated circuit device of claim 1, wherein the second metal is selected from molybdenum (Mo), copper (Cu), tungsten (W), cobalt (Co), ruthenium (Ru), manganese (Mn), titanium (Ti), tantalum (Ta), aluminum (Al), and a combination thereof.

8. The integrated circuit device of claim 1, wherein the conductive region includes an epitaxial semiconductor layer and a metal silicide film between the epitaxial semiconductor layer and the conductive barrier pattern,
wherein the conductive barrier pattern includes titanium (Ti), titanium nitride (TiN), tantalum (Ta), tantalum nitride (TaN), or a combination thereof, and
the first conductive plug includes molybdenum (Mo).

9. The integrated circuit device of claim 1, further comprising:
an upper insulating structure on the first conductive plug; and
an upper wiring structure passing through the upper insulating structure and extending to the first conductive plug in the vertical direction,
wherein the upper wiring structure includes an upper conductive plug including a third metal, the upper conductive plug being in contact with the first conductive plug.

10. The integrated circuit device of claim 1, further comprising:
an upper insulating structure on the first conductive plug; and
an upper wiring structure passing through the upper insulating structure and extending to the first conductive plug in the vertical direction,
wherein the upper wiring structure includes
an upper conductive plug passing through the upper insulating structure and extending in the vertical direction, the upper conductive plug including a third metal, wherein the third metal includes a different element from the second metal, and
an upper conductive barrier pattern between the first conductive plug and the upper conductive plug, the upper conductive barrier pattern including a first surface in contact with a top surface of the first conductive plug and a second surface in contact with the upper conductive plug,
wherein a bottom surface and a lower sidewall of the upper conductive plug are in contact with the upper conductive barrier pattern, and an upper sidewall of the upper conductive plug is in contact with the upper insulating structure, and
the upper conductive barrier pattern includes an upper vertical barrier portion between the upper insulating structure and the upper conductive plug, and the upper vertical barrier portion has a shape with a width in the lateral direction, the width tapering along a second direction away from the first conductive plug.

11. An integrated circuit device comprising:
a source/drain region on a substrate, the source/drain region having a top surface with a recess surface;
a metal silicide film along the recess surface of the source/drain region, the metal silicide film including a first metal;
an insulating film on the metal silicide film;
a first conductive plug passing through the insulating film and extending in a vertical direction, the first conductive plug including a second metal; and
a conductive barrier pattern between the metal silicide film and the first conductive plug, the conductive barrier pattern including a first surface in contact with the metal silicide film and a second surface in contact with the first conductive plug, wherein a bottom surface and a lower sidewall of the first conductive plug are in contact with the conductive barrier pattern, and an upper sidewall of the first conductive plug is in contact with the insulating film, and the conductive barrier pattern includes a vertical barrier portion between the insulating film and the first conductive plug and a trough portion connected to the vertical barrier portion, and the trough portion has a shape such that the first surface of the trough portion is convex and the second surface of the trough portion is concave, and the vertical barrier portion has a shape with a width of the shape of the vertical barrier portion in a lateral direction tapering along a first direction away from the metal silicide film such that the vertical barrier portion tapers to end at a position corresponding to a junction of the lower sidewall and the upper sidewall of the first conductive plug.

12. The integrated circuit device of claim 11, wherein
the vertical barrier portion of the conductive barrier pattern has a tapered surface facing the first conductive plug, and
a distance between the tapered surface and the insulating film decreases along the first direction away from a conductive region on the substrate.

13. The integrated circuit device of claim 11, wherein
the first metal includes a different element from the second metal, and
the second metal is selected from molybdenum (Mo), copper (Cu), tungsten (W), cobalt (Co), ruthenium (Ru), manganese (Mn), titanium (Ti), tantalum (Ta), aluminum (Al), and a combination thereof.

14. The integrated circuit device of claim 11, wherein
the first conductive plug includes molybdenum (Mo), copper (Cu), tungsten (W), cobalt (Co), ruthenium (Ru), manganese (Mn), titanium (Ti), tantalum (Ta), aluminum (Al), or a combination thereof, and
the conductive barrier pattern includes titanium (Ti), titanium nitride (TiN), tantalum (Ta), tantalum nitride (TaN), or a combination thereof.

15. The integrated circuit device of claim 11, wherein
the conductive barrier pattern has a thickness greater than 0 nm and equal to or less than 1 nm between the metal silicide film and the first conductive plug.

16. An integrated circuit device comprising:
a fin-type active region protruding over a substrate;
a source/drain region on the fin-type active region;
a metal silicide film in contact with a top surface of the source/drain region;
a gate line extending in a direction intersecting with the fin-type active region on the fin-type active region;
an insulating structure on the source/drain region, the metal silicide film, and the gate line;
a source/drain contact passing through a first portion of the insulating structure in a vertical direction, the source/drain contact being connected to the source/drain region through the metal silicide film; and
a gate contact passing through a second portion of the insulating structure in the vertical direction, the gate contact being connected to the gate line,
at least one of the source/drain contact and the gate contact including,
a first conductive plug passing through the insulating structure and extending in the vertical direction, the first conductive plug having an upper sidewall in contact with the insulating structure, and
a conductive barrier pattern covering a bottom surface and a lower sidewall of the first conductive plug, the conductive barrier pattern having a first surface in contact with the metal silicide film and a second surface in contact with the first conductive plug,
wherein
the conductive barrier pattern includes a vertical barrier portion between the insulating structure and the first conductive plug and a trough portion connected to the vertical barrier portion,
the trough portion has a shape such that the first surface of the trough portion is convex and the second surface of the trough portion is concave, and
the vertical barrier portion has a shape with a width of the shape of the vertical barrier portion in a lateral direction tapering along a first direction away from the substrate such that the vertical barrier portion tapers to end at a position corresponding to a junction of the lower sidewall and the upper sidewall of the first conductive plug.

17. The integrated circuit device of claim 16, wherein
the bottom surface and the lower sidewall of the first conductive plug are in contact with the conductive barrier pattern, and the conductive barrier pattern covers the first conductive plug to a thickness greater than 0 nm and equal to or less than 1 nm.

18. The integrated circuit device of claim 16, wherein
the metal silicide film includes a first metal,
the source/drain contact includes the first conductive plug including a second metal that is different from the first metal, and the second metal includes molybdenum (Mo), copper (Cu), tungsten (W), cobalt (Co), ruthenium (Ru), manganese (Mn), titanium (Ti), tantalum (Ta), aluminum (Al), or a combination thereof, and
the conductive barrier pattern includes titanium (Ti), titanium nitride (TiN), tantalum (Ta), tantalum nitride (TaN), or a combination thereof.

19. The integrated circuit device of claim 16,
further comprising an upper wiring structure passing through a third portion of the insulating structure and extending to the first conductive plug in the vertical direction,
wherein the first conductive plug and the upper wiring structure include a same metal, and the upper wiring structure includes an upper conductive plug in contact with the first conductive plug.

20. The integrated circuit device of claim 16,
further comprising an upper wiring structure passing through a third portion of the insulating structure and extending to the first conductive plug in the vertical direction,
wherein the upper wiring structure includes
an upper conductive plug passing through the third portion of the insulating structure and extending in the vertical direction, and
an upper conductive barrier pattern between the first conductive plug and the upper conductive plug, the upper conductive barrier pattern having a first surface in contact with a top surface of the first conductive plug and a second surface in contact with the upper conductive plug,
wherein the first conductive plug includes a different metal from the upper conductive plug, and
the upper conductive barrier pattern includes an upper vertical barrier portion between the insulating structure and the upper conductive plug, and the upper vertical barrier portion has a shape with a width in the lateral direction, the width tapering along a second direction away from the first conductive plug.

\* \* \* \* \*